(12) United States Patent
Matsueda

(10) Patent No.: US 10,312,295 B2
(45) Date of Patent: Jun. 4, 2019

(54) DISPLAY DEVICE, ELECTRO-OPTICAL DEVICE, ELECTRIC EQUIPMENT, METAL MASK, AND PIXEL ARRAY

(71) Applicant: TIANMA JAPAN, LTD., Kanagawa (JP)

(72) Inventor: Yojiro Matsueda, Kanagawa (JP)

(73) Assignee: TIANMA JAPAN, LTD., Kanagaw (JP)

( * ) Notice: Subject to any disclaimer, the term of this patent is extended or adjusted under 35 U.S.C. 154(b) by 0 days.

(21) Appl. No.: 15/972,734

(22) Filed: May 7, 2018

(65) Prior Publication Data
US 2018/0254306 A1    Sep. 6, 2018

Related U.S. Application Data

(62) Division of application No. 14/948,960, filed on Nov. 23, 2015, now abandoned.

(30) Foreign Application Priority Data

Nov. 26, 2014 (JP) ................................ 2014-238528

(51) Int. Cl.
*H01L 27/32* (2006.01)
*H01L 51/00* (2006.01)

(52) U.S. Cl.
CPC ...... *H01L 27/3218* (2013.01); *H01L 51/0011* (2013.01); *H01L 27/3216* (2013.01); *H01L 51/0097* (2013.01); *H01L 2251/5338* (2013.01); *Y10T 428/24298* (2015.01)

(58) Field of Classification Search
CPC ............ H01L 27/3211; H01L 27/3213; H01L 27/3216; H01L 27/3218; G02F 2201/52
See application file for complete search history.

(56) References Cited

U.S. PATENT DOCUMENTS

| 4,450,439 A | 5/1984 | Kobayashi |
| 6,771,028 B1 | 8/2004 | Winters |
| 9,013,098 B1 * | 4/2015 | Kim .................... H01L 27/3218 313/504 |
| 9,733,527 B2 * | 8/2017 | Takeda .............. G02F 1/134309 |
| 2001/0030508 A1 | 10/2001 | Utsugi et al. |

(Continued)

FOREIGN PATENT DOCUMENTS

| DE | 102011053276 | * | 3/2012 | ............. H01L 27/32 |
| EP | 2680310 | * | 2/2013 | ............. H01L 27/32 |

(Continued)

*Primary Examiner* — Victoria K. Hall
(74) *Attorney, Agent, or Firm* — Young & Thompson

(57) ABSTRACT

A metal mask for making a display device. The display device includes a plurality of pixels, each of the pixels including sub-pixels of a first color, a second color, and a third color, the sub-pixels of the first and second colors being color in a column, and the sub-pixel of the third color being in a row with respect to the sub-pixels of the first and second colors. The metal mask forms the sub-pixels of the third color and includes a plurality of first openings in a first column and a plurality of second openings in a second column next to the first column, where each of the first openings has a first side that is directly opposite, in a direction perpendicular to the first column, respective parts of second sides of both of an adjacent pair of the second openings.

9 Claims, 43 Drawing Sheets

(56) References Cited

U.S. PATENT DOCUMENTS

| | | |
|---|---|---|
| 2002/0186214 A1 | 12/2002 | Siwinski |
| 2004/0113875 A1 | 6/2004 | Miller et al. |
| 2004/0201558 A1* | 10/2004 | Arnold ................. G09G 3/3216 345/83 |
| 2005/0168423 A1 | 8/2005 | Hirata et al. |
| 2009/0121983 A1* | 5/2009 | Sung ................... H01L 27/3216 345/76 |
| 2009/0322215 A1* | 12/2009 | Sung ................... H01L 27/3211 313/504 |
| 2010/0270912 A1 | 10/2010 | Ko |
| 2011/0291550 A1 | 12/2011 | Kim et al. |
| 2012/0056531 A1* | 3/2012 | Park ................... H01L 51/5036 313/506 |
| 2014/0197396 A1* | 7/2014 | Madigan ............. H01L 51/0005 257/40 |
| 2014/0246654 A1* | 9/2014 | Huang ................. H01L 27/326 257/40 |
| 2015/0236077 A1* | 8/2015 | Huang ................. H01L 27/326 257/40 |
| 2017/0061849 A1* | 3/2017 | Matsueda ............ G09G 3/2003 |
| 2018/0143721 A1* | 5/2018 | Matsueda ............. G06F 3/0412 |
| 2018/0315801 A1* | 11/2018 | Matsueda ........... H01L 27/3218 |

FOREIGN PATENT DOCUMENTS

| | | |
|---|---|---|
| JP | 2005-206881 | 8/2005 |
| JP | 2011-249334 | 12/2011 |

* cited by examiner

OUTPUT CHARACTERISTIC OF M2 DRIVING TFT

ORGANIC EL
DISPLAY APPARATUS

ORGANIC EL
DISPLAY APPARATUS

DISPLAY DEVICE, ELECTRO-OPTICAL DEVICE, ELECTRIC EQUIPMENT, METAL MASK, AND PIXEL ARRAY

TECHNICAL FIELD

The present invention relates to a display device and an electro-optical device which comprises the display device, electric equipment which uses the electro-optical device as a display apparatus, a metal mask for manufacturing the display device, and a pixel array.

BACKGROUND OF THE INVENTION

An organic electro luminescence (EL) element is a current-driven type self-luminous element, therefore it has advantages that low power consumption, high viewing angle, high contrast ratio, and the like are obtained, as well as there is no need for a backlight, and it is considered to facilitate the ongoing development of flat panel displays.

An organic EL display apparatus using the above-described organic EL element forms a plurality of pixels by using sub-pixels of respective colors of red (R), green (G) and blue (B). Thereby, a variety of color images are displayed thereon. These sub-pixels of RGB may be arranged in various forms, however, as illustrated in FIG. 1, are generally arranged in a stripe type (a so-called RGB vertical stripe type) in which sub-pixels of the same color are equally arranged. By controlling the brightness between the sub-pixels of the three colors, it is possible to display all colors. Commonly, three sub-pixels of R, G and B adjacent to each other are treated as one rectangular pixel as a whole, and these pixels are disposed in a square shape, thereby achieving a dot matrix display. In the dot matrix type display apparatus, image data to be displayed are an n×m matrix arrangement, and by associating the image data with the pixels one to one, it is possible to display a correct image.

In addition, the organic EL display apparatus has a color filter type that produces three colors of R, G and B by a color filter based on a white organic EL element, and a side-by-side selective deposition type that selectively deposits organic EL materials of three colors of R, G and B with individually different colors. The color filter type has a drawback in that the utilization rate of light is reduced because the color filter absorbs light, and power consumption increases. Whereas, the side-by-side selective deposition type is an easy means to provide a wide color gamut due to high color purity, and has no color filter, therefore the utilization rate of light is increased. For these reasons, the side-by-side selective deposition type has been widely used.

SUMMARY OF THE INVENTION

In the above-described side-by-side selective deposition type, in order to selectively deposit organic EL materials with individually different colors, a fine metal mask (FMM) is used. Recently, with the higher definition of the organic EL display apparatus, a pitch of the FMM also becomes finer, and manufacturing thereof is difficult. For such a problem, a pixel arrangement structure (a so-called Pentile type) has been proposed, in which, by utilizing that human color vision is insensitive to R and B, and sensitive to G, as illustrated in FIG. 2, the sub-pixels are formed of the two colors G and B, or two colors G and R, and color representation required by the sub-pixels of a color missing compared to a RGB arrangement is spuriously reproduced by combining with the pixel having the adjacent sub-pixels of the corresponding color (see, for example, U.S. Pat. No. 6,771,028, U.S. Patent Application Publication No. 2002/0186214, U.S. Patent Application Publication No. 2004/0113875 and U.S. Patent Application Publication No. 2004/0201558).

In the Pentile type, since the dot width of R and B can be secured two vertical stripes by reducing the number of the sub-pixels, it is possible to increase an opening size of the FMM, and facilitate the manufacture of a high-definition organic EL display apparatus. However, the Pentile type is configured to alleviate failure of the color due to a decrease in the number of sub-pixels by a tiling method. Therefore, problems such as the occurrence of a jagged edge in which a curve which is originally smoothly displayed becomes a stepped shape, viewing a change of color in a line shape in an image having continuously changed gradation and brightness of color, or the like may occur.

From such a background, a pixel arrangement structure has been proposed which may have dimensions of the sub-pixels being larger than the conventional RGB vertical stripe type, and hardly causes a deterioration in display quality such as the Pentile type. As illustrated in FIG. 3, there is a pixel arrangement structure (a so-called S stripe type) in which the R and G are arranged in the same column, and the B is disposed in the next column of R and G and in the row of R and G (see Japanese Patent Laid-Open Publication No. 2011-249334). In the S stripe type, since the width of the sub-pixels can be wider than the RGB vertical stripe type, the opening size of the FMM may be increased, as well as, since the sub-pixels of RGB are disposed within one pixel, the display quality may be improved more than the Pentile type.

Herein, when selectively depositing the organic EL materials using the FMM, an FMM having opening parts formed at positions corresponding to the sub-pixels of each color is used. However, in the above-described S stripe type, because the sub-pixels of B are arranged in a row, the opening parts corresponding to the sub-pixels of B are formed in a slit shape (a shape in which the opening parts are connected to each other at adjacent pixels), and the opening parts corresponding to the sub-pixels of R and the sub-pixels of G are formed in a slot shape (a shape in which the opening parts are independent for each pixel).

However, when the opening part is formed in a slit shape, since the FMM becomes a structure in which a plurality of elongated metal thin plates are separately arranged as much as the width of the sub-pixels of B, it is difficult to form the FMM with the dimensions as designed. In addition, if the metal thin plates are not maintained in a state of being pulled from both sides thereof in a longitudinal direction, they come into contact with each other, and therefore it is difficult to handle the FMM. Further, since the metal thin plates contacting with each other may be easily deformed during peeling off, it is not possible to deposit the organic EL materials with the dimensions as designed, and manufacturing yield of the display device may be decreased. In particular, when improving the resolution of the display device according to the requirements of high definition in recent years, it is necessary to further decrease the pixel size, and the width and arrangement interval of the metal thin plate become narrowed as the pixel size is reduced, such that the above-described problems are more pronounced.

For the above-described problems, the opening parts corresponding to the sub-pixels of B may be formed in a slot shape, however, due to the processing accuracy and strength of the FMM, it is necessary for the opening parts adjacent to each other to be separated by a predetermined interval. In addition, by leaving the interval between the opening parts, a region in which the organic EL material of B is deposited is narrowed, such that a light emitting region of B formed within the region is also narrowed. Herein, the lifespan (degradation rate) of the organic EL materials of each color of RGB is different from each other, and the organic EL material of B has the shortest lifespan. Therefore, due to the light emitting region of B being narrowed, the lifespan of the display apparatus becomes shorter.

Thus, in order to increase the slot-shaped opening parts corresponding to the sub-pixels of B as much as possible, a structure has been proposed in which one opening part is provided for the two sub-pixels of B adjacent to each other in a direction in which the sub-pixels of B are continued. In this structure, since the organic EL material of B is deposited over the two sub-pixels of B, the light emitting regions of the two sub-pixels of B may be expanded toward a center of the two sub-pixels of B, and the lifespan of the display apparatus may be increased.

However, if the light emitting regions of the two sub-pixels of B are expanded toward the center, the positions of the light emitting regions of the sub-pixels of B are changed at an upper pixel and a lower pixel, and a deviation in a distribution of the luminosity factor at the upper and lower pixels occurs. In particular, in the case of an arrangement structure (a structure in which the sub-pixels of G are disposed on a lower side) of the sub-pixels illustrated in FIG. 3, in the lower pixel, due to the light emitting region of the sub-pixel of B being expanded to the upper side, the interval between the light emitting region of the sub-pixel of B and the light emitting region of the sub-pixel of G having the highest luminosity factor is increased. When an edge of the image to be displayed is overlapped with the lower pixel, a phenomenon wherein the edge is seen as colored (a so-called color edge) occurs, and the display quality of the display apparatus is decreased. That is, the effects of the color edge are different according to the position of a display pattern. For example, when displaying a pattern of a simple white horizontal line, colors in odd rows and even rows appear different from each other. Since the visibility as the display for performing data display is significantly deteriorated, this is a fatal defect.

According to one aspect of the present invention, there is provided a display device, comprising a plurality of rectangular pixels arranged in two dimensions, each of the plurality of rectangular pixels being provided with a sub-pixel of a first color with the highest luminosity factor, a sub-pixel of a second color and a sub-pixel of a third color with the lowest luminosity factor, wherein the sub-pixel of the first color and the sub-pixel of the second color are arranged in a column direction, the sub-pixel of the third color is arranged in a row direction with respect to the sub-pixel of the first color and the sub-pixel of the second color, each of the sub-pixels of the respective colors includes a transistor which drives the sub-pixel, an anode electrode connected to the transistor, an element separation membrane formed on the anode electrode, a light emitting layer formed so as to cover an opening part which is provided in the element separation membrane and defines a light emitting region of the sub-pixel, and a cathode electrode formed on the light emitting layer, the pixels adjacent to each other in the column direction are configured to form a set of an even row and a next odd row in an even column, and form a set of an odd row and a next even row in an odd column, and in the two sub-pixels of the third color of the two pixels of the respective sets, the light emitting layers are continuously formed, the light emitting regions are separated from each other and the light emitting regions are disposed to be line symmetric with respect to a center line partitioning the two sub-pixels of the third color.

According to another aspect of the present invention, there is provided an electro-optical device, comprising the above display device.

According to another aspect of the present invention, there is provided electric equipment, comprising an organic electro luminescence apparatus in which the above display device is formed on a flexible substrate as a display apparatus.

According to another aspect of the present invention, there is provided a metal mask which is used during forming a pixel array on a substrate, wherein, in the pixel array, a plurality of rectangular pixels are arranged in two dimensions, and each of the plurality of rectangular pixels is provided with a sub-pixel of a first color with the highest luminosity factor, a sub-pixel of a second color and a sub-pixel of a third color with the lowest luminosity factor, the sub-pixel of the first color and the sub-pixel of the second color are arranged in a column direction, the sub-pixel of the third color is arranged in a row direction with respect to the sub-pixel of the first color and the sub-pixel of the second color, and a metal mask for forming the sub-pixel of the third color includes an opening part extending over the two sub-pixels of the third color adjacent to each other in the column direction, and the opening part is shifted one row in an even column and an odd column.

According to another aspect of the present invention, there is provided a pixel array, comprising a plurality of rectangular pixels arranged in two dimensions, each of the plurality of rectangular pixels being provided with a sub-pixel of a first color with the highest luminosity factor, a sub-pixel of a second color and a sub-pixel of a third color with the lowest luminosity factor, wherein the sub-pixel of the first color and the sub-pixel of the second color are arranged in a column direction, the sub-pixel of the third color is arranged in a row direction with respect to the sub-pixel of the first color and the sub-pixel of the second color, the pixels adjacent to each other in the column direction are configured to form a set of an even row and a next odd row in an even column, and form a set of an odd row and a next even row in an odd column, and two sub-pixels of the third color of the two pixels of the respective sets include light emitting regions which are disposed to be line symmetric with respect to a center line partitioning the two sub-pixels of the third color.

It is to be understood that both the foregoing general description and the following detailed description are exemplary and explanatory and are not restrictive of the invention.

The above and further objects and features will more fully be apparent from the following detailed description with accompanying drawings.

BRIEF DESCRIPTION OF THE SEVERAL VIEWS OF THE DRAWINGS

FIG. 9 is an example of the organic EL display apparatus of the present embodiment, and, the shape and configuration thereof may be appropriately modified.

DETAILED DESCRIPTION ON THE INVENTION

Figure 4:
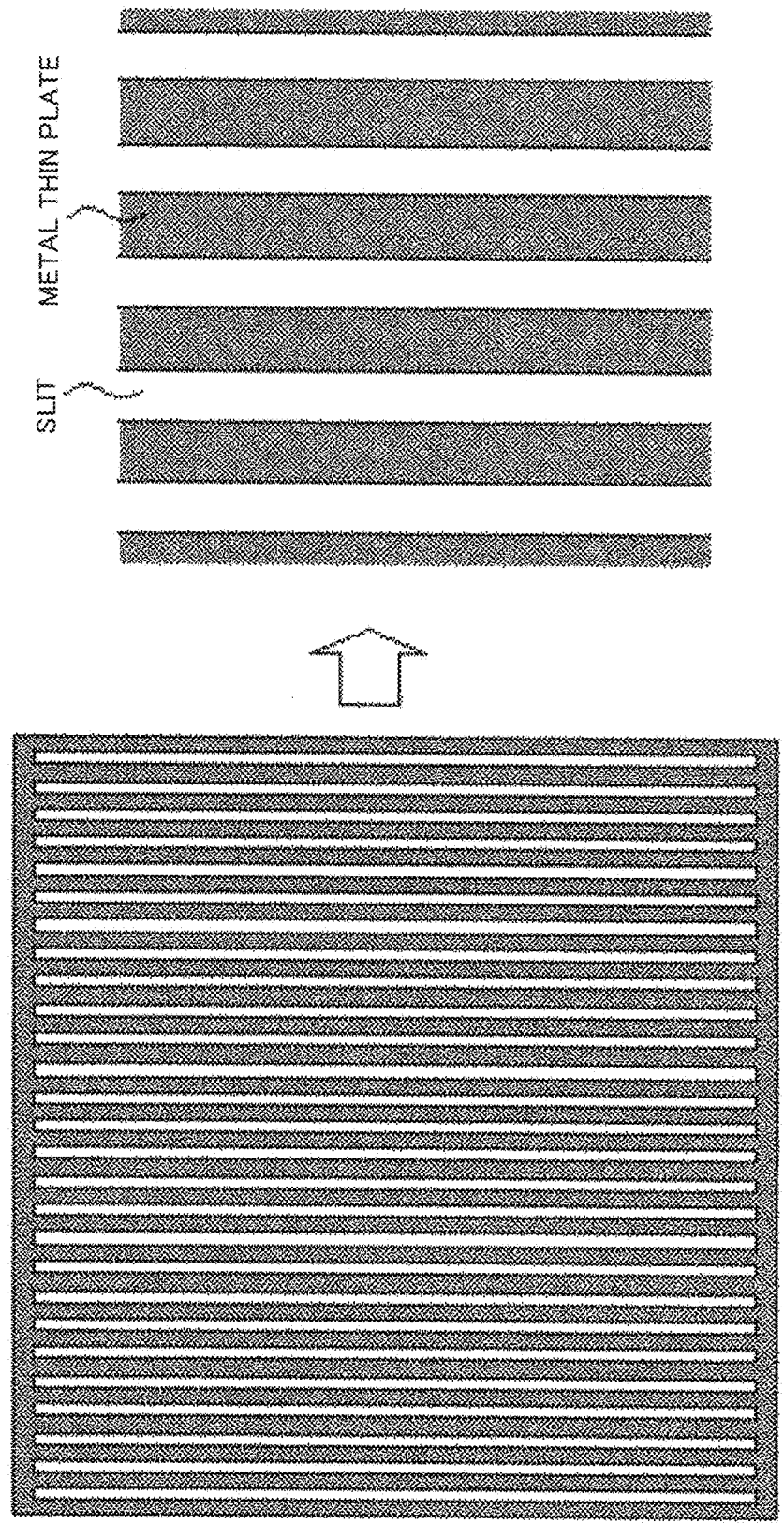
FIG. 4 is plan views schematically illustrating a configuration (for B sub-pixels) of a metal mask of the related art.
Figure 5:
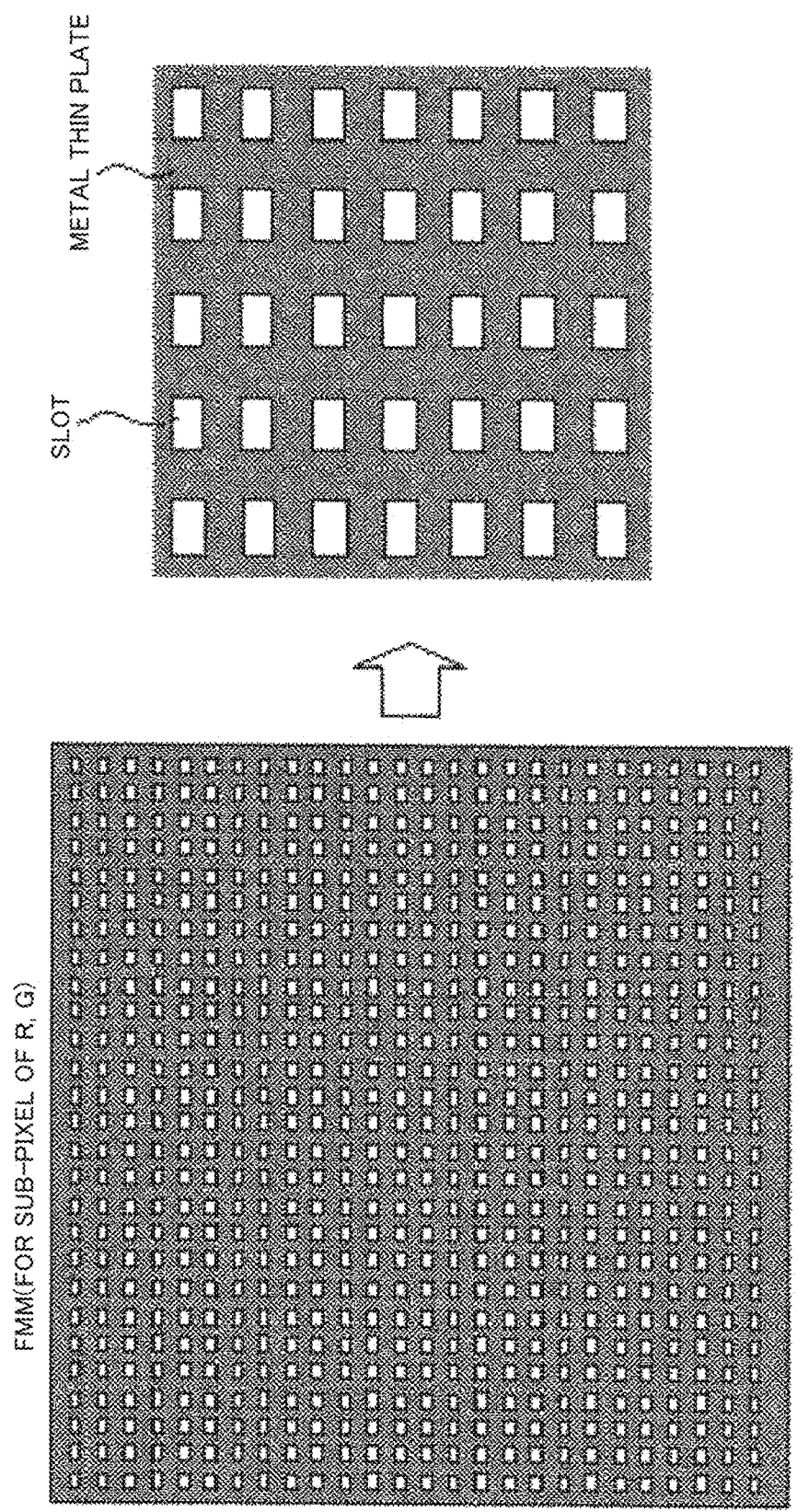
FIG. 5 is plan views schematically illustrating a configuration (for R and G sub-pixels) of a metal mask of the related art.
Figure 6:
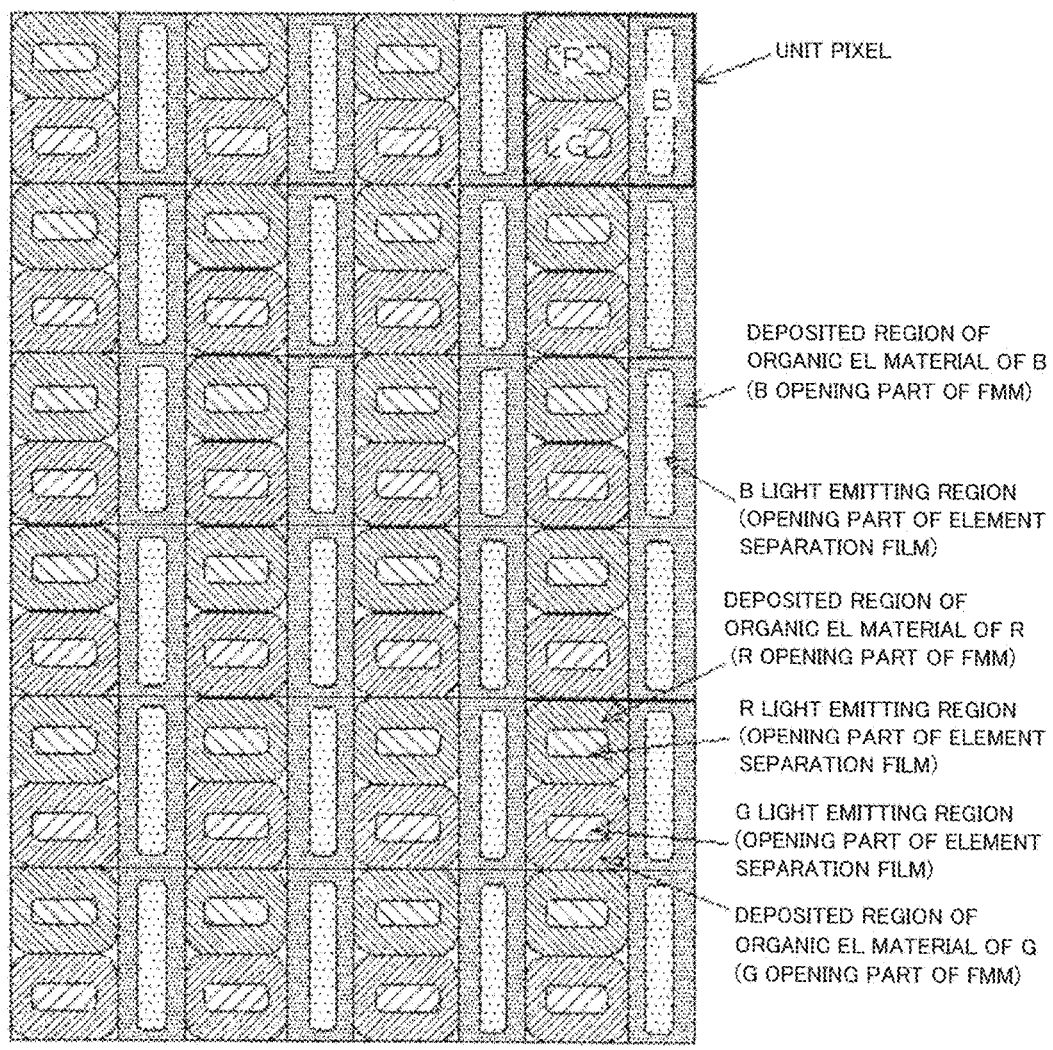
FIG. 6 is a plan view schematically illustrating the S stripe type pixel arrangement structure (when all the B sub-pixels are manufactured by a slit FMM) of an organic EL display apparatus of the related art.

As described in the background, when selectively depositing the organic EL materials using the FMM, in the S stripe type, the opening parts of the FMM corresponding to the sub-pixels of B are formed in a slit shape (a shape in which the opening parts are connected to each other at adjacent pixels) as illustrated in FIG. 4, and the opening parts of the FMM corresponding to the sub-pixels of R and the sub-pixels of G are formed in a slot shape (a shape in which the opening parts are independent for each pixel) as illustrated in FIG. 5. As described above, when a pixel array is formed using the FMM having slit-shaped opening parts for B, and using the FMM having slot-shaped opening parts for R and G, as illustrated in FIG. 6, the organic EL material of B (a hatched portion of fine dots) can be deposited over a unit pixel (a portion surrounded by a thick solid line), such that the light emitting region of B of each pixel (a hatched portion of coarse dots) may be increased.

However, when forming the opening parts of B in a slit shape, since the FMM becomes a structure in which a plurality of elongated metal thin plates are separately arranged by as much as the width of the sub-pixels of B, it is difficult to make and handle the FMM. In addition, after the metal thin plates come into contact, since these plates may be easily deformed when they are peeled off, manufacturing yield of the display device may be decreased. In particular, when decreasing the pixel size for improving the resolution, it is further difficult to make and handle the FMM, such that the above-described problem is more pronounced.

Figure 7:
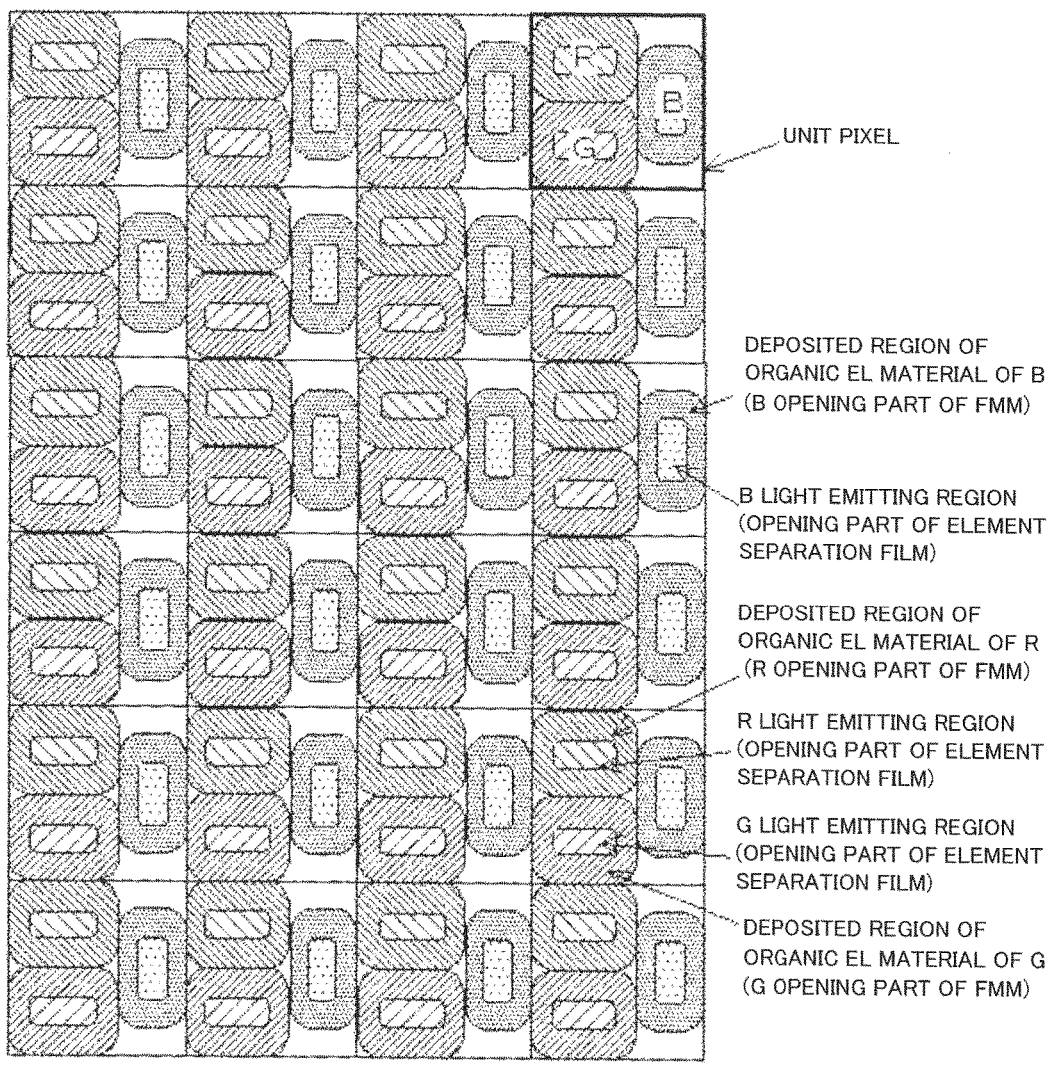
FIG. 7 is a plan view schematically illustrating the S stripe type pixel arrangement structure (when individual B sub-pixels are manufactured by a slot FMM) of an organic EL display apparatus of the related art.

In order to prevent the problem occurring when the opening parts are formed in a slit shape, as illustrated in FIG. 7, the opening parts of the FMM corresponding to the respective sub-pixels of B may be formed in a slot shape.

However, in order to secure the strength of the FMM, it is necessary for the opening parts adjacent to each other to be separated by a predetermined interval. Therefore, a region in which an organic EL material of B having the shortest lifespan is deposited, is narrowed, and the lifespan of the display apparatus becomes shorter.

Figure 8:
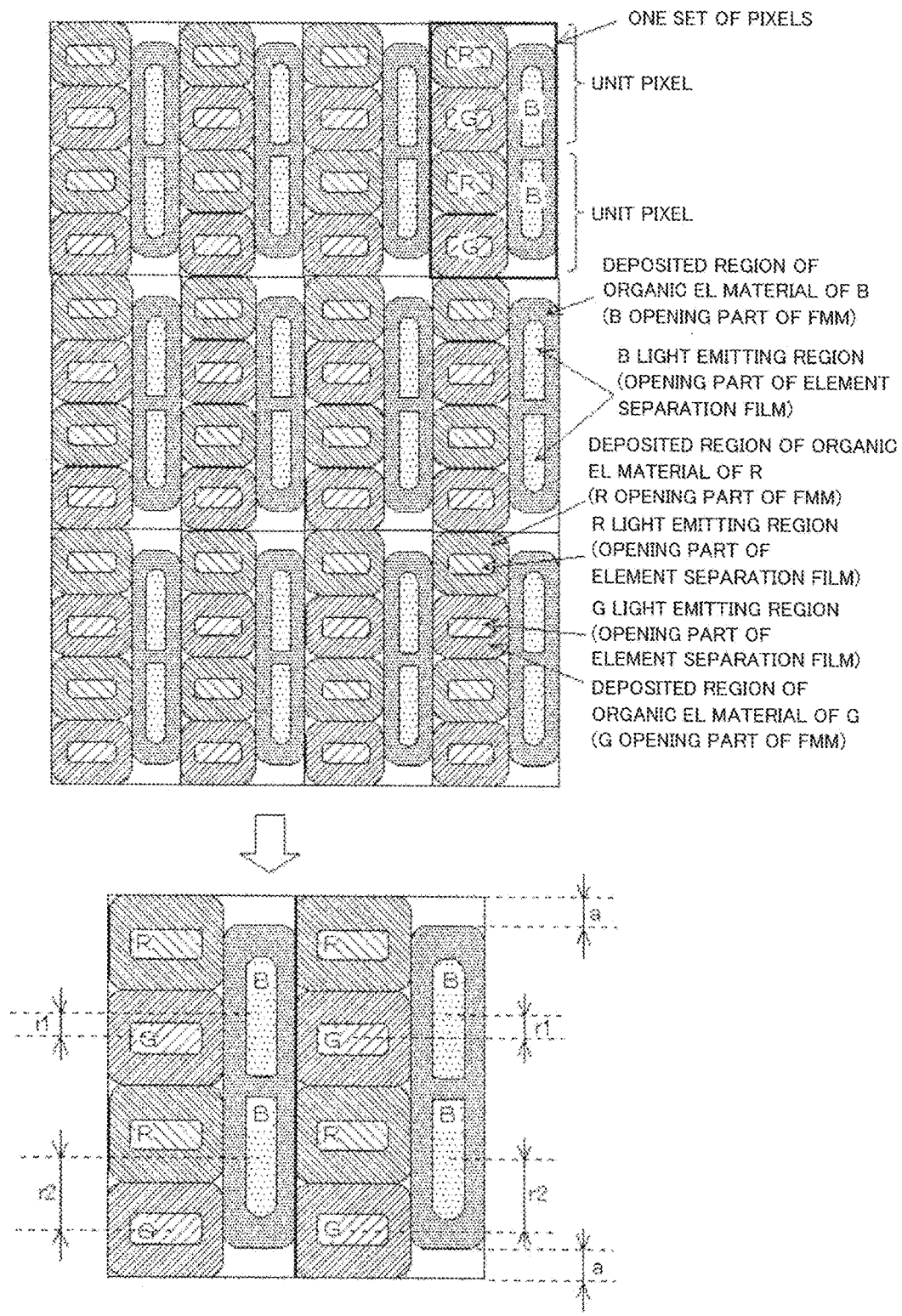
FIG. 8 is plan views schematically illustrating the S stripe type pixel arrangement structure (when two sub-pixels of B adjacent to each other in a column direction are manufactured by the slot FMM as a set) of an organic EL display apparatus of the related art.

For this problem, as illustrated in FIG. 8, it also may be configured in such a manner that one opening part is provided for two sub-pixels of B adjacent to each other in the column direction (a vertical direction of FIG. 8), and the organic EL material is deposited over the two sub-pixels of B, such that the light emitting regions of the respective sub-pixels of B are expanded toward a center of the two sub-pixels of B. However, when the light emitting regions of the sub-pixels of B are expanded toward the center thereof, central positions of the light emitting regions of the sub-pixels of B are changed at an upper pixel and a lower pixel. As a result, intervals in the column direction between the centers of the light emitting regions of the sub-pixels of B and the centers of the light emitting regions of G having the highest luminosity factor are changed at the upper pixel and the lower pixel (see r1 and r2 of FIG. 8), and distributions of the luminosity factor are changed. In particular, in the lower pixel, due to the light emitting region of the sub-pixel of B being shifted to the upper side, the interval between the light emitting region of the sub-pixel of B and the light emitting region of the sub-pixel of G is increased. Thereby, since the deviation in a distribution of the luminosity factor is increased, when an edge of the image to be displayed is overlapped with the lower pixel, the color edge occurs, and display quality is decreased.

That is, in order to improve the manufacturing yield of the display device by facilitating manufacture and handling of the FMM, it is preferable that the opening parts of the FMM for the sub-pixels of B are also formed in a slot shape. However, if the opening parts of the FMM for the sub-pixels of B are formed in a slot shape, the light emitting regions of B having the shortest lifespan may be narrowed, and the lifespan of the display apparatus may be shortened. In addition, in order to expand the light emitting regions of B, a method of providing one opening part for the two sub-pixels of B vertically adjacent to each other may also be considered. However, in this method, the positions of the sub-pixels of B are changed at the upper pixel and the lower pixel, and the color edge occurs, such that the display quality of the display apparatus is deteriorated. Accordingly, in the conventional method, when the opening parts of the FMM for the sub-pixels of B are formed in a slot shape, it is not possible to simultaneously achieve an increase in lifespan and an improvement in display quality of the display apparatus.

Therefore, in one embodiment, the two sub-pixels of B adjacent to each other in the column direction are made as a set, and one slot-shaped opening part is provided for the set, as well as the slot-shaped opening parts are disposed by shifting row by row in even columns and odd columns (i.e., the slot-shaped opening parts are obliquely disposed), thereby the deviations in a distribution of the luminosity factor at the pixels of even rows and the pixels of odd rows are averaged, so that the color edge is less obvious. In addition, in order to decrease the deviations in the distribution of the luminosity factor at the pixels of even rows and the pixels of odd rows, the positions of the light emitting regions of the sub-pixels of B are shifted with respect to the positions of the light emitting regions of the sub-pixels of R and G (the central positions of the light emitting regions of the two sub-pixels of B are shifted in the column direction and in a direction from the sub-pixel of R toward the sub-pixel of G within the pixel, with respect to the central position of the two pixels forming the set).

Hereinafter, the present embodiment will be described in detail with reference to the accompanying drawings. Herein, an electro-optical element refers to a general electronic element in which the optical state of light is changed by an electrical action, and includes an electronic element such as a liquid crystal element which displays an image with gradation by changing a polarized state of light, in addition to a self-luminous element such as an organic EL element or the like. In addition, an electro-optical device is a display apparatus which displays an image using the electro-optical element. In the present embodiment, the organic EL element is preferably employed, and by using the organic EL element, it is possible to obtain a current-driven light emitting element which self-emits light by the current driving. In this regard, hereinafter, the present embodiment will be described with respect to the organic EL element.

Figure 9:
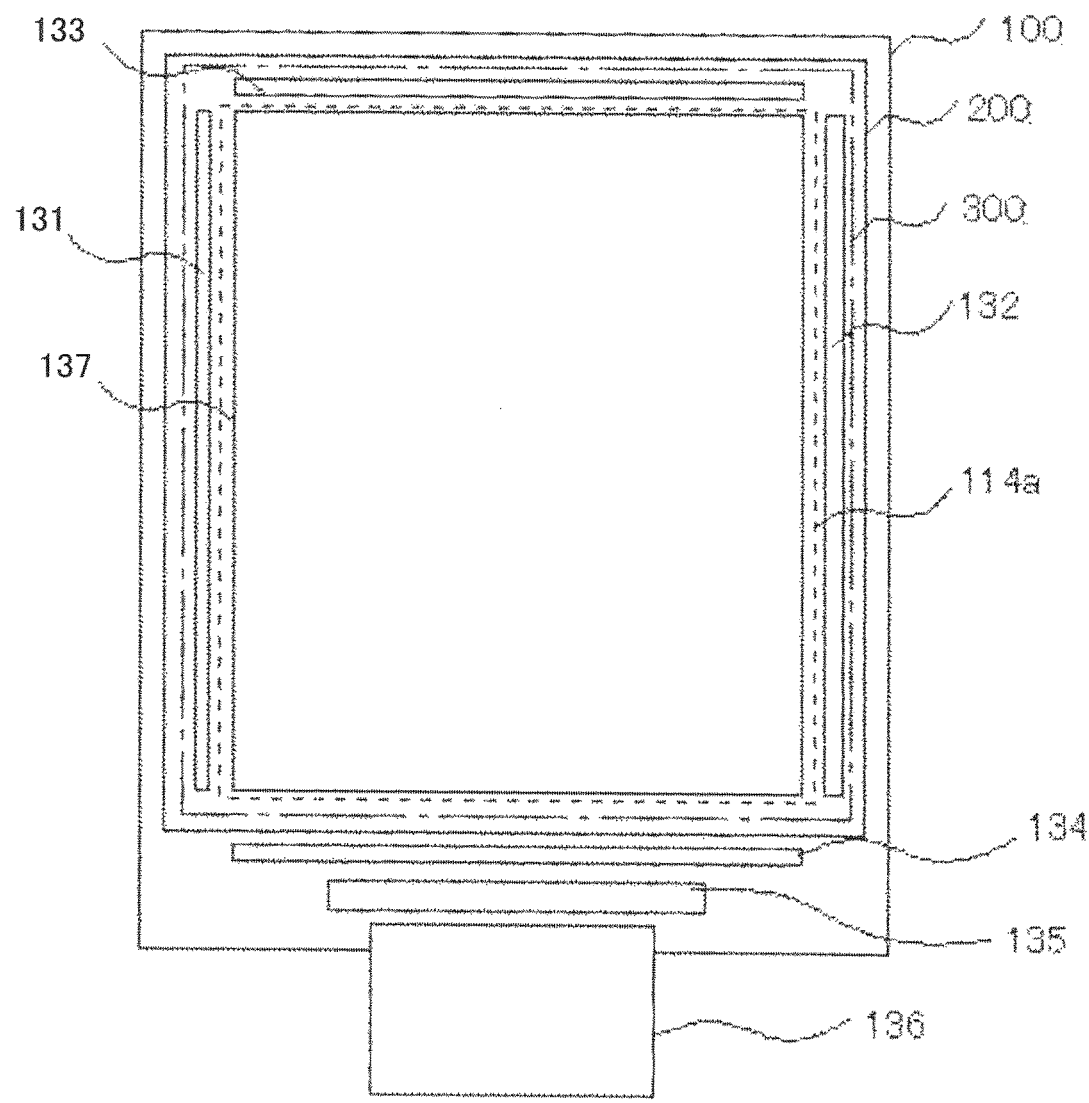
FIG. 9 illustrates an organic EL display apparatus as an example of the electro-optical device. The organic EL display apparatus generally comprises a thin film transistor (TFT) substrate 100 on which a light emitting element is formed, a sealing glass substrate 200 for sealing the light emitting element, and a joining means 300 (a glass frit sealing part) for joining the TFT substrate 100 and the sealing glass substrate 200. In addition, the organic EL display apparatus comprises a scanning driver 131 (a TFT circuit) for driving a scanning line of the TFT substrate 100, an emission control driver 132 (a TFT circuit) for controlling a light emitting period of each pixel, a data line electrostatic-discharge (ESD) protection circuit 133 for preventing damage due to electro-static-discharge, a demultiplexer 134 (1:n DeMUX) (an analog switch TFT) for restoring a data stream with a high transfer rate to a plurality of data streams with an original low transfer rate, a data driver IC 135 which is mounted using an anisotropic conductive film (ACF) to drive data lines, and the like, which are disposed around a cathode electrode formation region 114a formed outside of a display region 137 (an active matrix part) of the TFT substrate 100, and connected to an external device through a flexible printed circuit (FPC) 136. Further.

FIG. 9 illustrates an organic EL display apparatus as an example of the electro-optical device. The organic EL display apparatus generally comprises a thin film transistor (TFT) substrate 100 on which a light emitting element is formed, a sealing glass substrate 200 for sealing the light emitting element, and a joining means 300 (a glass frit sealing part) for joining the TFT substrate 100 and the sealing glass substrate 200. In addition, the organic EL display apparatus comprises a scanning driver 131 (a TFT circuit) for driving a scanning line of the TFT substrate 100, an emission control driver 132 (a TFT circuit) for controlling a light emitting period of each pixel, a data line electro-static-discharge (ESD) protection circuit 133 for preventing damage due to electro-static-discharge, a demultiplexer 134 (1:n DeMUX) (an analog switch TFT) for restoring a data stream with a high transfer rate to a plurality of data streams with an original low transfer rate, a data driver IC 135 which is mounted using an anisotropic conductive film (ACF) to drive data lines, and the like, which are disposed around a cathode electrode formation region 114a formed outside of a display region 137 (an active matrix part) of the TFT substrate 100, and connected to an external device through a flexible printed circuit (FPC) 136. Further, FIG. 9 is an example of the organic EL display apparatus of the present embodiment, and, the shape and configuration thereof may be appropriately modified.

Figure 10:
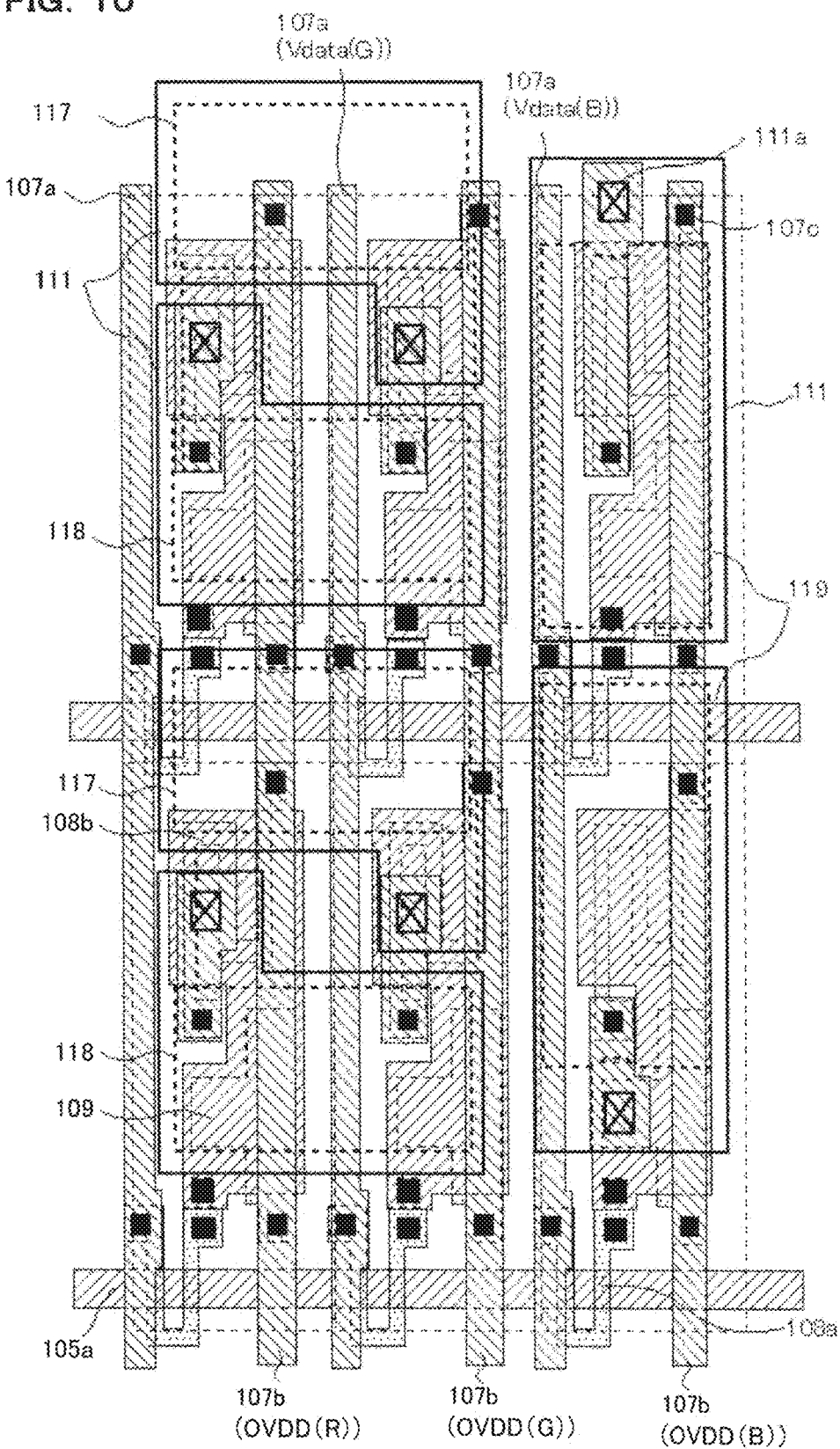
In FIG. 10, one pixel includes three regions located between the data lines 107a and the power supply lines 107b facing each other, and an M1 switch TFT 108a, an M2 driving TFT 108b, and the holding capacitor part 109 are disposed in the respective regions. Herein, in the case of the RGB vertical stripe type pixel arrangement structure, the anode electrode 111 is formed by dividing the anode electrode 111 into the above-described three regions, and is configured to drive the light emitting elements 116 formed in these regions by using the M1 switch TFT 108a, the M2 driving TFT 108b and the holding capacitor part 109 of the respective regions. However, in the present embodiment, in order to achieve the pixel arrangement structure of present embodiment with the similar structure as the RGB vertical stripe type, the anode electrodes 111 for the sub-pixel of R and the sub-pixel of G are formed over the two regions.
Figure 11:
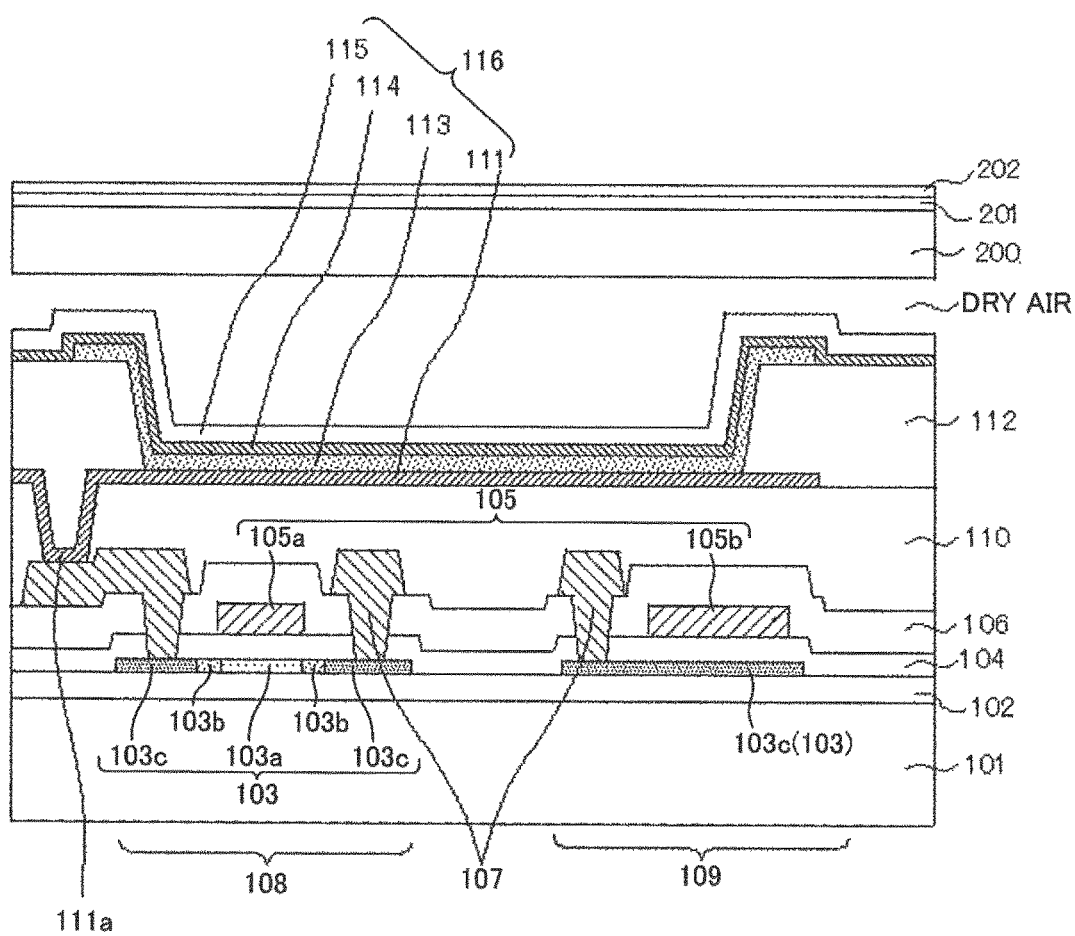
FIG. 11 is a cross-sectional view schematically illustrating the configuration of the pixel (corresponding to one sub-pixel) of the organic EL display apparatus according to one embodiment.

FIG. 10 is a plan view highlighting two pixels (six sub-pixels) vertically adjacent to each other in a column direction of the light emitting element formed on the TFT substrate 100, and the sets including the two pixels are repeatedly disposed in the column direction (vertical direction of FIG. 10). Further, in the adjacent columns (not illustrated), the sets including the two pixels are repeatedly disposed in the column direction (vertical direction) by shifting one pixel. That is, the sets including the two pixels are obliquely and alternately disposed, so that an even row and the next odd row form a set in the even columns, and an odd row and the next even row form a set in the odd columns. In addition, FIG. 11 is a cross-sectional view highlighting one sub-pixel. Furthermore, in order to make it easy to understand a structure of the sub-pixels of the present embodiment, FIG. 11 describes the sub-pixel in a simplified manner by excluding the regions of an M2 driving TFT 108b (a TFT unit 108) and a holding capacitor part 109 from the plan view of FIG. 10.

The TFT substrate 100 includes polysilicon layers 103 which are formed on a glass substrate 101 through an underlying insulation film 102 and made of low-temperature polysilicon (LTPS), etc., first metal layers 105 (a gate electrode 105a and a holding capacitor electrode 105b) which are formed through a gate insulation film 104, second metal layers 107 (data lines 107a, power supply lines 107b, source/drain electrodes, and first contact parts 107c) which are connected to the polysilicon layers 103 (an i layer 103a, a p– layer 103b, and a p+ layer 103c) through openings formed in an interlayer insulation film 106, and a light emitting element 116 (an anode electrode 111, an organic EL layer 113, a cathode electrode 114 and a cap layer 115) which is formed through a flattened film 110.

Dry air is sealed between the light emitting element 116 and the sealing glass substrate 200, and is sealed by the glass frit sealing part 300 to form the organic EL display apparatus. The light emitting element 116 is a top-emission structure, and the light emitting element 116 and the sealing glass substrate 200 are set at a predetermined interval. Herein, the sealing glass substrate 200 has a λ/4 retardation plate 201 and a polarizing plate 202 formed on a light emitting surface side thereof, and is configured to control the reflection of light made incident thereon from an outside.

In FIG. 10, one pixel includes three regions located between the data lines 107a and the power supply lines 107b facing each other, and an M1 switch TFT 108a, an M2 driving TFT 108b, and the holding capacitor part 109 are disposed in the respective regions. Herein, in the case of the RGB vertical stripe type pixel arrangement structure, the anode electrode 111 is formed by dividing the anode electrode 111 into the above-described three regions, and is configured to drive the light emitting elements 116 formed in these regions by using the M1 switch TFT 108a, the M2 driving TFT 108b and the holding capacitor part 109 of the respective regions. However, in the present embodiment, in order to achieve the pixel arrangement structure of present embodiment with the similar structure as the RGB vertical stripe type, the anode electrodes 111 for the sub-pixel of R and the sub-pixel of G are formed over the two regions.

Specifically, with regard to the sub-pixel of B which is a color having the lowest luminosity factor, since the anode electrode 111 (a thick solid line on a right side of FIG. 10) is mainly formed in a longitudinally long shape along the data line 107a of B and the power supply line 107b of B, the light emitting element 116 emits light in B light emitting region 119 on the right side of each pixel (a thick dashed line on the right side of FIG. 10). Meanwhile, with regard to the sub-pixel of R, since the anode electrode 111 is formed in an upper half of the region ranging from the data line 107a of R to the power supply line 107b of G, the light emitting element 116 emits light in an R light emitting region 117 on the upper left of each pixel. In addition, with regard to the sub-pixel of G which is a color having the highest luminosity factor, since the anode electrode 111 is formed in a lower half of the region ranging from the data line 107a of R to the power supply line 107b of G, the light emitting element 116 emits light in a G light emitting region 118 on the lower left of each pixel. Further, the color having the highest luminosity factor and the color having the lowest luminosity factor in the present disclosure and the claims are a relative sense, and refer to "the highest" and "the lowest" when compared between a plurality of sub-pixels included in one pixel.

That is, the sub-pixel of each color is driven by using the M1 switch TFT 108a, the M2 driving TFT 108b and the holding capacitor part 109 which are formed in a region surrounded by the data line 107a and the power supply line 107b of the corresponding color, but the anode electrodes 111 for the sub-pixels of R and G are formed, by dividing the anode electrodes 111 into upper regions and lower regions in the column direction, over a region surrounded by the data line 107*a* and the power supply line 107*b* of R, and a region surrounded by the data line 107*a* and the power supply line 107*b* of G. Therefore, second contact parts 111*a* which connect the anode electrodes 111 with the source/drain electrodes of the M2 driving TFTs 108*b* are disposed as illustrated in FIG. 10.

In addition, in order to control a crosstalk from the data line 107*a*, the M1 switch TFT 108*a* has a dual gate structure as illustrated in FIG. 10. The M2 driving TFT 108*b* for converting a voltage to a current is formed in a routing shape as illustrated in FIG. 10 to minimize variations in the manufacturing process, thereby securing a sufficient channel length. Further, by extending the gate electrode of the driving TFT and using as an electrode of the holding capacitor part 109, it is possible to secure a sufficient holding capacitance in a limited area. By forming the above-described pixel structure, it is possible to increase the light emitting regions for the respective colors of RGB, and reduce the current density per a unit area of each color to obtain a necessary luminance, and thereby enabling the long lifespan of the light emitting element.

Furthermore, FIG. 11 illustrates the top-emission structure in which light radiated from the light emitting element 116 is radiated through the sealing glass substrate 200 to an outside, but a bottom-emission structure of radiating light through the glass substrate 101 may also be employed.

Herein, in the present embodiment, one opening part of the FMM is provided for the two sub-pixels of B vertically adjacent to each other in the column direction, and the organic EL material of B is deposited over the two sub-pixels of B. The B light emitting region 119 in an upper sub-pixel of B is expanded to the lower side as much as possible, and the B light emitting region 119 in a lower sub-pixel of B is expanded to the upper side as much as possible, such that shapes of the B light emitting regions 119 are formed to be line symmetric with respect to the center line of the two sub-pixels of B, and thereby the area of the B light emitting regions 119 is increased, and the lifespan of the display apparatus may be increased.

As described above, in the two sub-pixels of B, the organic EL material of B is continuous, and the sets including the two pixels are repeatedly disposed in the column direction (vertical direction of FIG. 10), as well as, in the adjacent columns (not illustrated), the sets including the two pixels are repeatedly disposed in the column direction by vertically shifting one pixel. Therefore, the deposited region of the organic EL material of B is examined by analyzing the material of the display element, such that it is possible to determine whether a pixel array is the pixel arrangement structure of the present embodiment. In addition, it is also possible to determine whether a pixel array is the pixel arrangement structure of the present embodiment, by observing the shape of the B light emitting regions 119.

Specifically, as illustrated in FIG. 11, in the second contact part 111*a* which connects the anode electrode 111 with the source/drain electrodes of the M2 driving TFT 108*b* (the TFT unit 108), since the anode electrode 111 is formed in a hollowed shape (concave shape), it is not possible to uniformly form the organic EL layer 113 thereon. Thereby, an element separation film 112 formed on the anode electrode 111 is removed at a position which is not overlapped with the second contact part 111*a* to form an opening part, and the organic EL layer 113 and the cathode electrode 114 are formed in the opening part to function as the light emitting element 116. Therefore, the light emitting element 116 is formed in a deformed shape so as to avoid the vicinity of the second contact part 111*a*.

Figure 12:
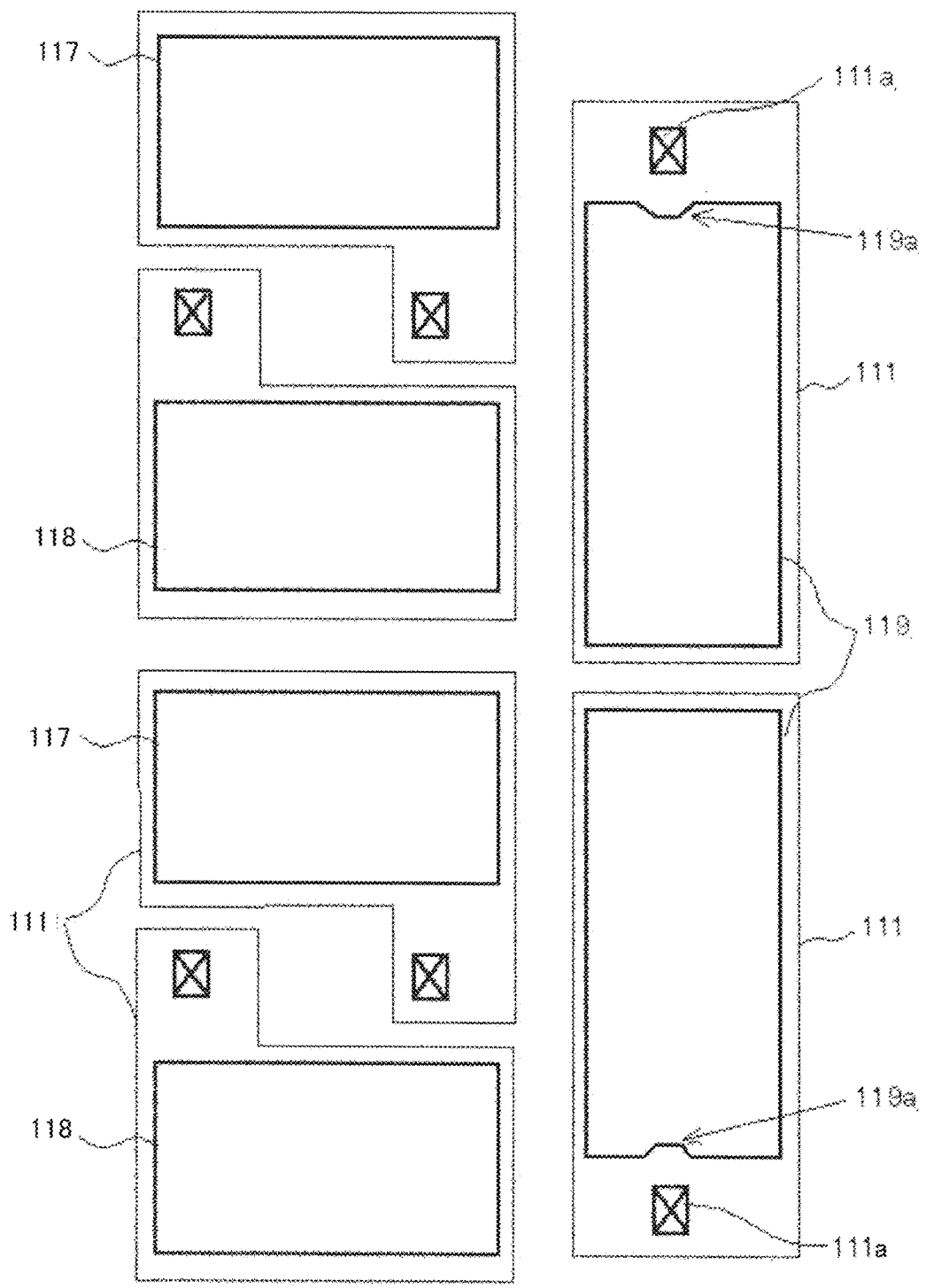
FIG. 12 is a plan view highlighting light emitting regions and contact parts of the pixels (corresponding to six sub-pixels) of the organic EL display apparatus according to one embodiment.

FIG. 12 is a view in which the anode electrodes 111, the light emitting regions 117 to 119, and the second contact parts 111*a* (portions where x marks are added in rectangles) are extracted from FIG. 10. As it is possible to sufficiently secure the distance between the R light emitting region 117 and the second contact part 111*a*, the R light emitting region 117 is formed in a substantially rectangular shape. In addition, as it is possible to sufficiently secure the distance between the G light emitting region 118 and the second contact part 111*a*, the G light emitting region 118 is also formed in a substantially rectangular shape. Compared to this, it is necessary to increase the area of the B light emitting region 119 as much as possible so as to extend the lifespan of the apparatus. As a result, a portion being close to the second contact part 111*a* occurs, and thereby a concave 119*a* is formed at a portion in which the distance between the B light emitting region 119 and the second contact part 111*a* is short. Further, for the layout of the second contact part 111*a*, the concave 119*a* is formed at an upper side part in the upper B light emitting region 119 and at a lower side part in the lower B light emitting region 119.

As described above, in the pixel array of the present embodiment, since the concaves 119*a* are formed at the line symmetric positions with respect to the center line of the two sub-pixels of B in the upper and lower B light emitting regions 119 adjacent to each other in the column direction of two pixels forming the set, even after a display apparatus having the pixel array assembled therein is formed, by observing the shape of the B light emitting region 119 under magnification, it is possible to confirm whether a pixel array is the pixel arrangement structure of the present embodiment. Furthermore, since the concave 119*a* is sufficiently smaller than the B light emitting region 119, it does not affect the display quality.

Figure 13:
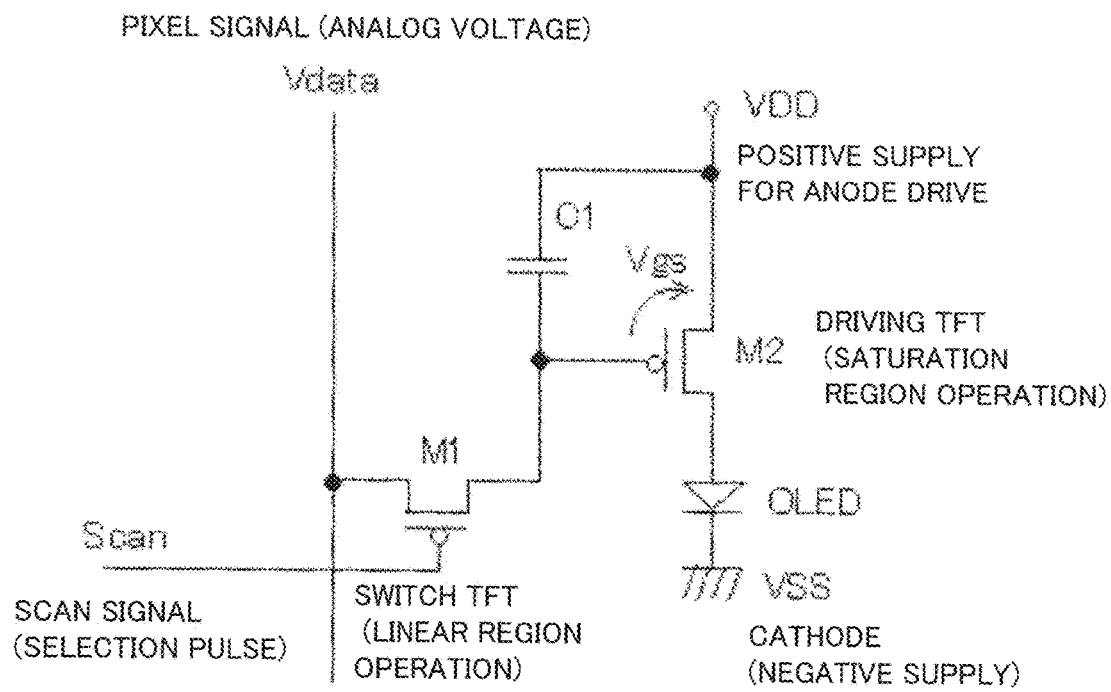
FIG. 13 is a view illustrating the configuration of a main circuit in the pixel of the organic EL display apparatus according to one embodiment.
Figure 14:
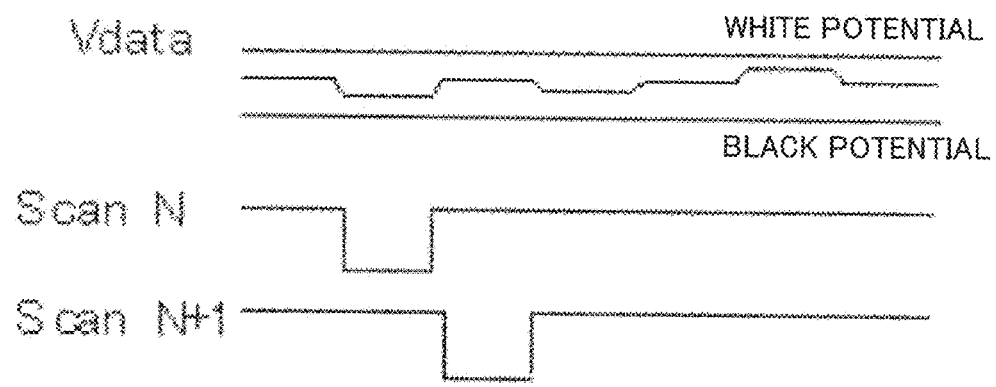
FIG. 14 is a waveform diagram of the pixel of the organic EL display apparatus according to one embodiment.
Figure 15:
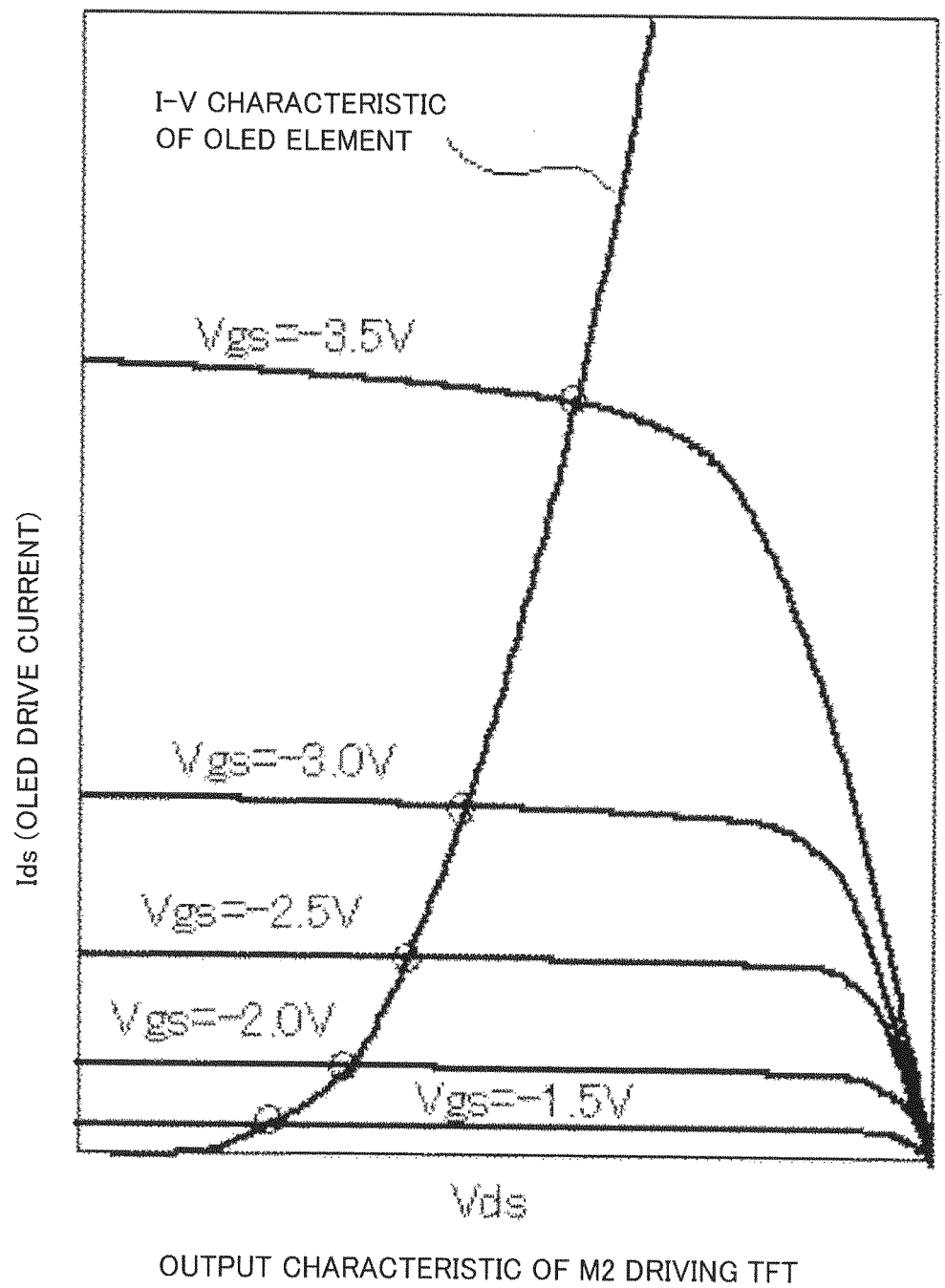
FIG. 15 is a diagram illustrating output characteristics of a driving TFT of the organic EL display apparatus according to one embodiment.

Next, a method of driving each sub-pixel will be described with reference to FIGS. 13 to 15. FIG. 13 is a view illustrating a configuration of a main circuit of the sub-pixel, FIG. 14 is a waveform diagram thereof, and FIG. 15 is a diagram illustrating output characteristics of the driving TFT. Each sub-pixel includes an M1 switch TFT, an M2 driving TFT, a C1 holding capacitor, and a light emitting element (OLED), and is driven and controlled by a two-transistor method. The M1 switch TFT is a p channel field effect transistor (FET), and a gate terminal thereof is connected with the scanning line (Scan), and a source terminal thereof is connected with the data line (Vdata). The M2 driving TFT is a p channel FET, and a gate terminal thereof is connected to a drain terminal of the M1 switch TFT. In addition, a source terminal of the M2 driving TFT is connected to a power supply line (VDD), and a drain terminal thereof is connected to the light emitting element (OLED). Further, the C1 holding capacitor is formed between the gate/source of the M2 driving TFT.

In the above configuration, a selection pulse is output to the scanning line (Scan), and when the M1 switch TFT is in an open state, the data signal supplied through the data line (Vdata) is written in the C1 holding capacitor as a voltage value. The holding voltage written in the C 1 holding capacitor is held through one frame period, and by the holding voltage, the conductance of the M2 driving TFT is changed in an analog manner, and a forward bias current corresponding to the light emitting gradation is supplied to the light emitting element (OLED).

As described above, by driving the light emitting element (OLED) with a constant current, even when the resistance is changed due to a deterioration of the light emitting element (OLED), it is possible to constantly maintain light emission luminance. Therefore, it is suitable as the method of driving the organic EL display apparatus of present embodiment.

Figure 16:
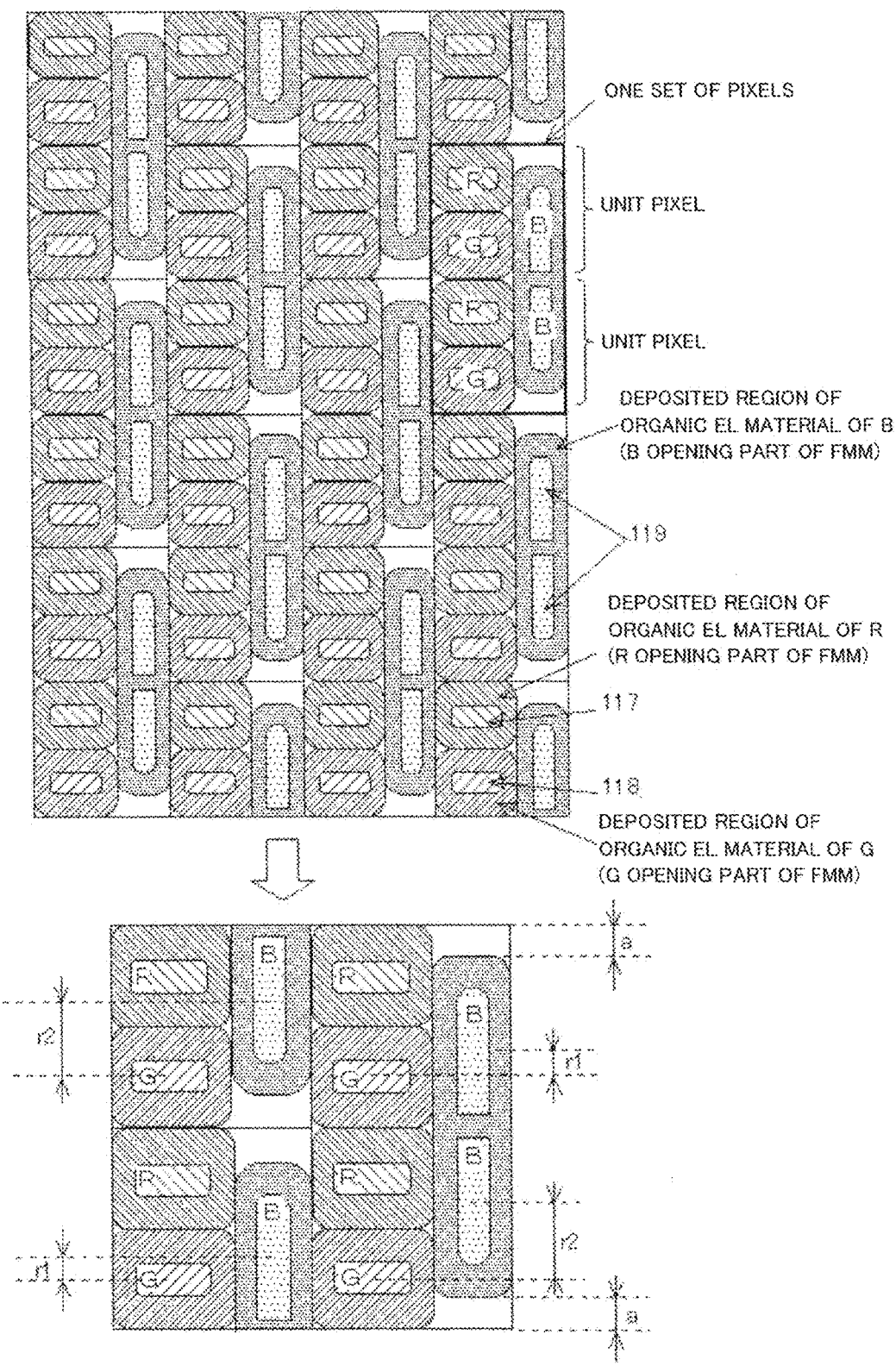
FIG. 16 is plan views illustrating a pixel arrangement structure (first pixel arrangement structure) according to one embodiment.
Figure 17:
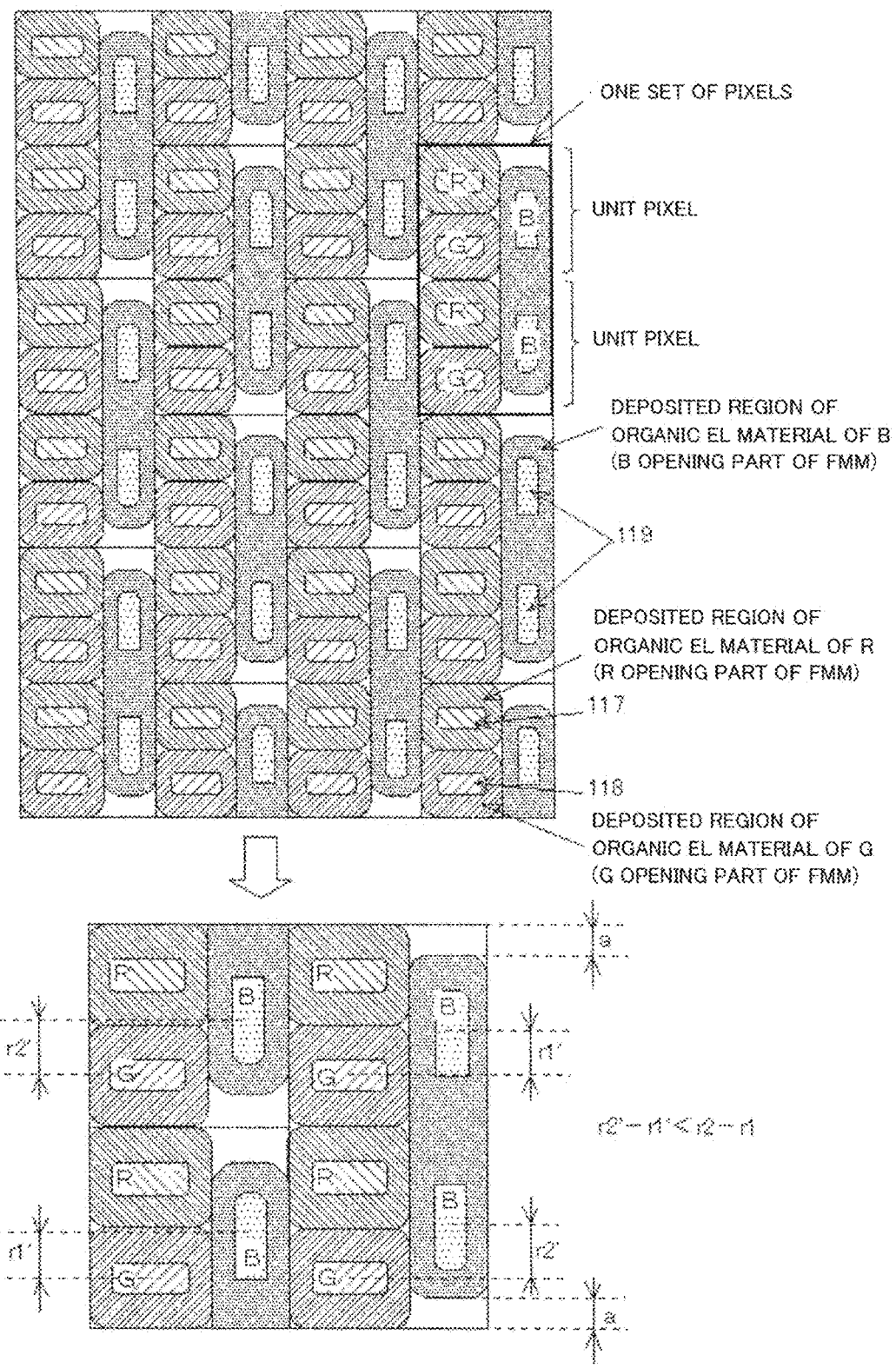
FIG. 17 is plan views illustrating a pixel arrangement structure (second pixel arrangement structure) according to one embodiment.
Figure 18:
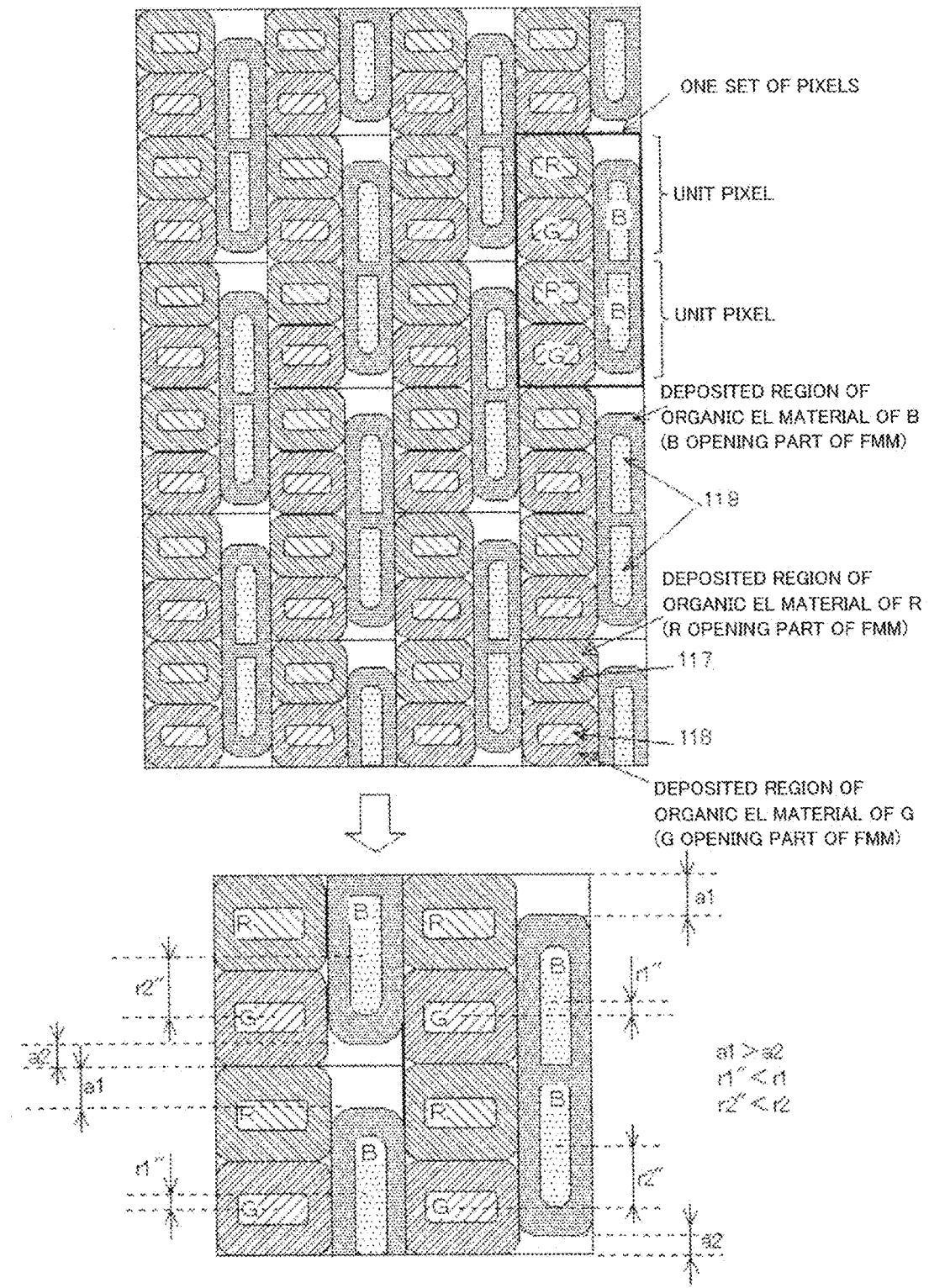
FIG. 18 is plan views illustrating a pixel arrangement structure (third pixel arrangement structure) according to one embodiment.

Next, the pixel arrangement structure of the organic EL display apparatus having the above-described structure will be described with reference to FIGS. 16 to 18. Further, each of the sub-pixels of RGB illustrated in FIGS. 16 to 18 is illustrated as the light emitting region (the portion in which the organic EL layer 113 is located between the anode electrode 111 and the cathode electrode 114 in FIG. 11) which functions as a light emitting element. The light emitting region corresponds to the opening part of the element separation film 112. When the organic EL material is selectively deposited using the FMM, the FMM having opening parts slightly larger than the light emitting regions is aligned to the TFT substrate to be set, and the organic EL material is selectively deposited thereon. Since the current actually flows only through the opening parts of the element separation film 112, these portions become the light emitting regions. If an opening pattern of the FMM is overlapped with the opening parts of the other colors (i.e. if the region for depositing the organic EL material is expanded), a failure (color shift) in which other light emitting colors are mixed occurs. In addition, if the opening pattern of the FMM enters inside from the opening parts (i.e. if the region for depositing the organic EL material is narrowed), a failure (vertical short circuit failure) in which the anode electrode 111 and the cathode electrode 114 are short circuited occurs. Accordingly, in general, the opening pattern of the FMM is designed so as to be opened on a boundary line of a substantial middle between the light emitting regions of the other colors and the light emitting region of its own color. Alignment accuracy and the deformation amount of the FMM are worse than the accuracy of a photo process, but since the actual light emitting region is determined by the light emitting region opened by the photo process, it is possible to precisely control the area no matter what the shape is. In addition, the boundary line (solid line) of each pixel in FIGS. 16 to 18 is not defined by component members of the TFT substrate 100, and is defined by a relation with the set of sub-pixels adjacent to each other when the sets of sub-pixels are repeatedly disposed, wherein it has a rectangular shape, but may have a shape other than a rectangle.

Figure 1:
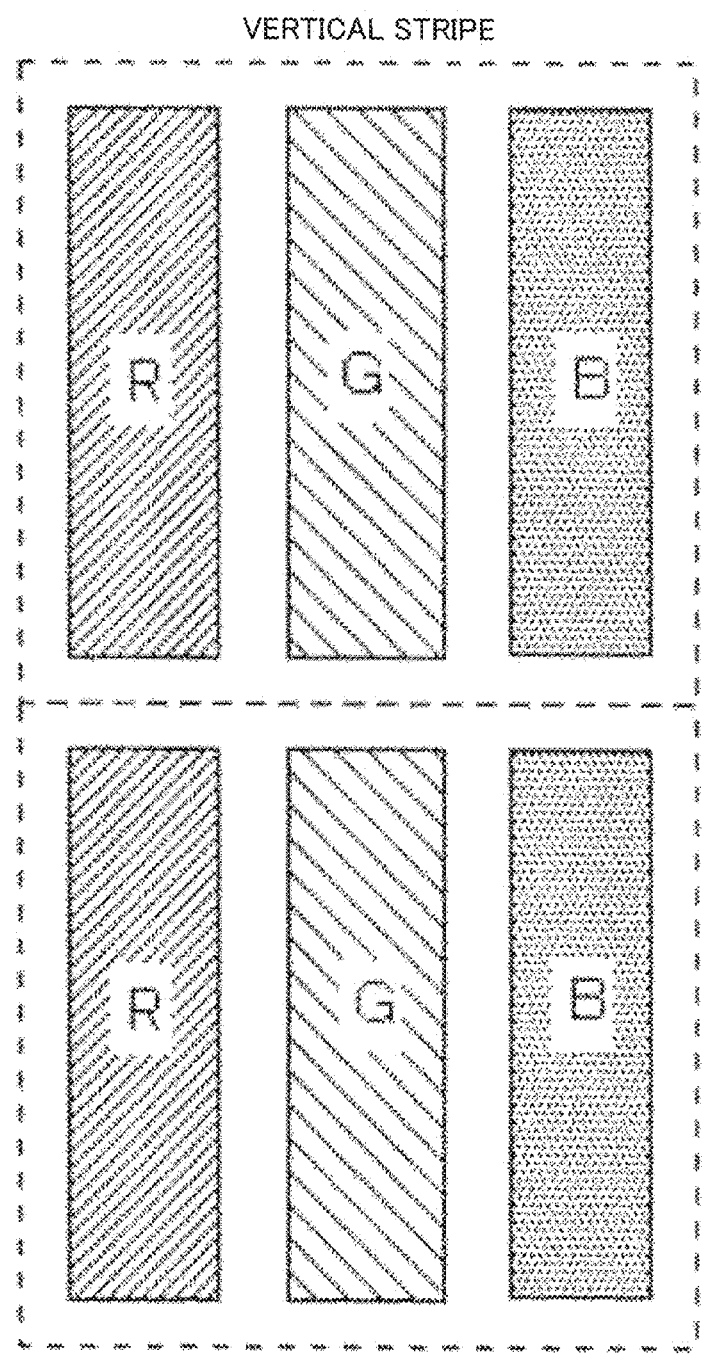
FIG. 1 is a plan view schematically illustrating a pixel arrangement structure (RGB vertical stripe type) of an organic EL display apparatus of the related art.
Figure 2:
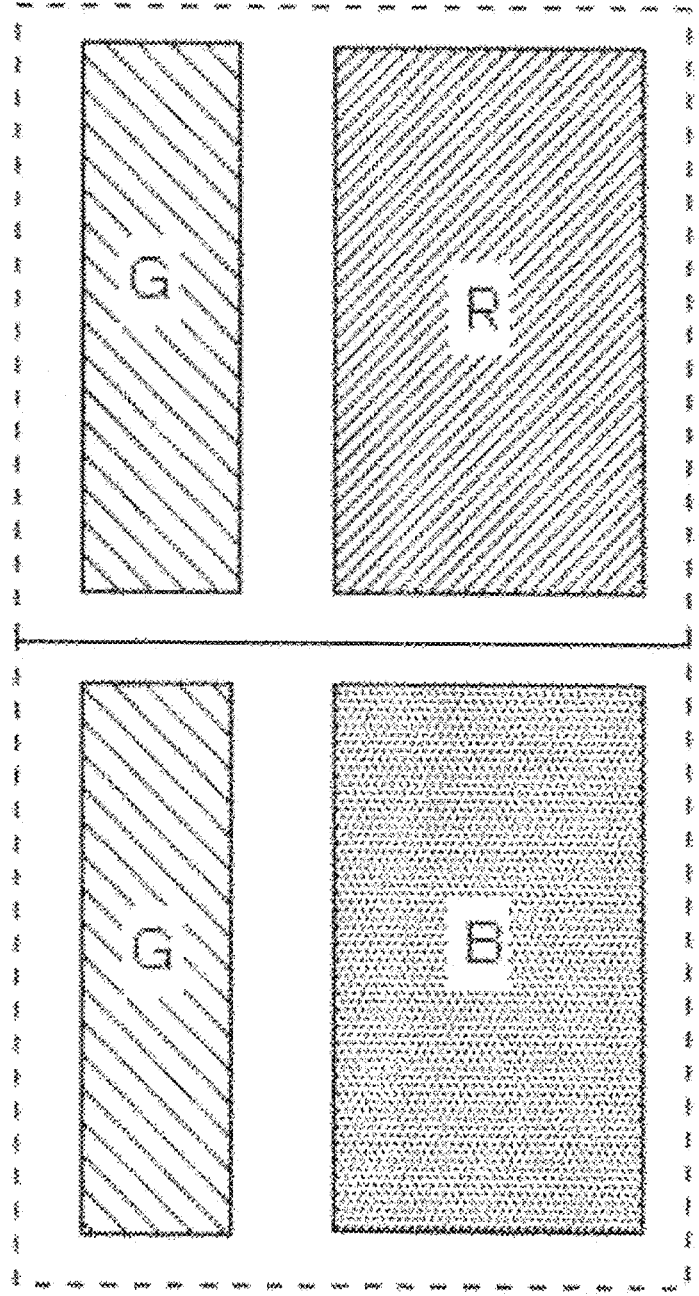
FIG. 2 is a plan view schematically illustrating a pixel arrangement structure (Pentile type) of an organic EL display apparatus of the related art.
Figure 3:
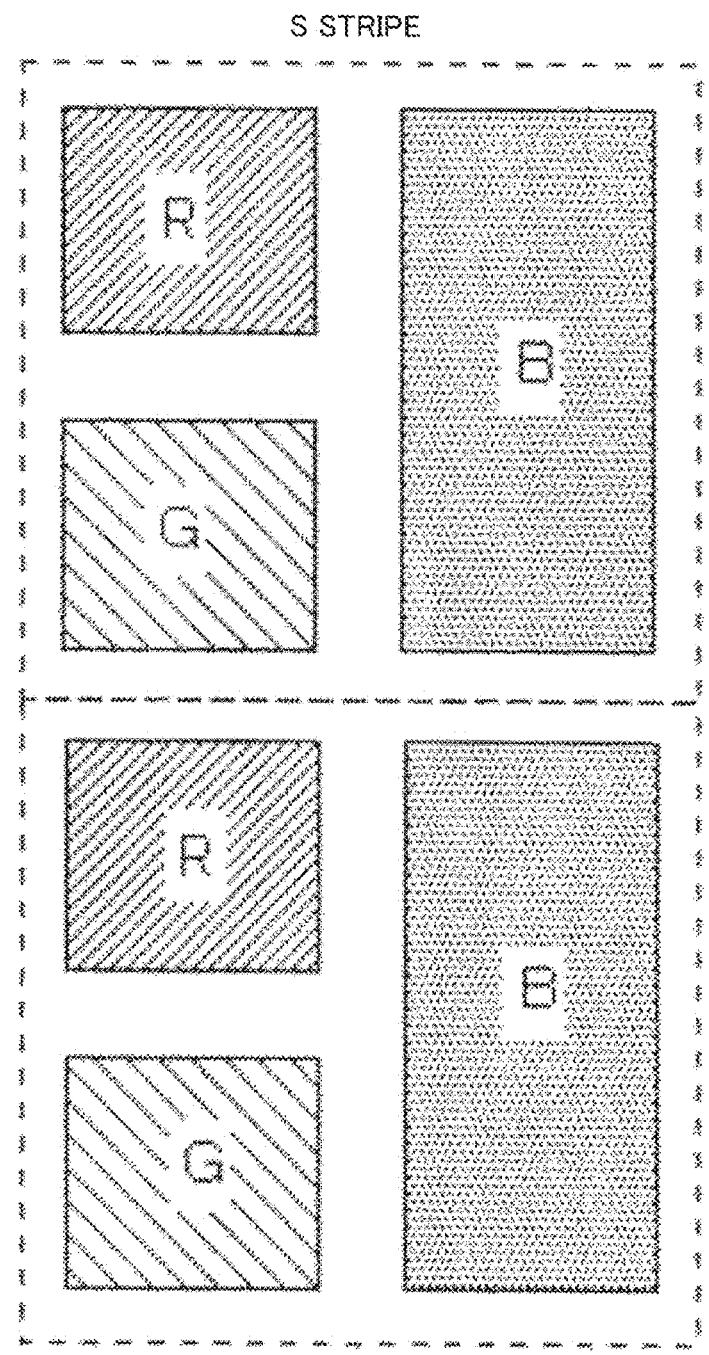
FIG. 3 is a plan view schematically illustrating a pixel arrangement structure (S stripe type) of an organic EL display apparatus of the related art.

As illustrated in FIG. 16, the basic structure of the pixel arrangement of the present embodiment is a structure in which, in the S stripe type pixel arrangement structure (the pixel arrangement structure in which the sub-pixel of R and the sub-pixel of G are disposed in the column direction, and the sub-pixel of B is disposed in the row direction with respect to the sub-pixel of R and the sub-pixel of G) illustrated in FIG. 3, two pixels of an even row and the next odd row are made as one set for the even column, and two pixels of the odd row and the next even row are made as one set for the odd column, as well as the organic EL material of the sub-pixels of B in two pixels of each set is continuous, and the light emitting regions of the sub-pixels of B in two pixels of each set are line symmetric with respect to the center line of the two pixels. Further, in order to individually drive the two sub-pixels of B of the same set, the anode electrodes 111 are separated from each other, and as illustrated in FIG. 12, the second contact parts 111a which connect the anode electrodes 111 with the drain terminals of the TFT units 108 (the M2 driving TFTs 108b) are disposed to be line symmetric with respect to the center line of the two sub-pixels of B, and the concaves 119a are formed at the B light emitting regions 119 in the vicinity of the portions in which the second contact parts 111a are disposed. Therefore, strictly speaking, the light emitting regions 119 of the respective sub-pixels of B become a shape in which the concaves 119a are formed to be line symmetric with respect to the center line of the two sub-pixels of B, but the light emitting region of each sub-pixel is illustrated in a substantially rectangular shape in FIG. 16.

In FIG. 16, as described above, the deposited regions of the organic EL material are defined by the opening parts of the FMM, and the light emitting regions are defined by the opening parts of the element separation film 112. However, in order to prevent the short circuit between the anode electrode 111 and the cathode electrode 114 and the color shift in which other light emitting colors are mixed, the opening parts of the element separation film 112 are formed inside with respect to the deposited regions of the organic EL material, in anticipation of a margin defined by the accuracy of the manufacturing process. Further, in the same deposited region of the organic EL material of B, the two light emitting regions of B are also formed at a predetermined interval, in anticipation of the margin defined by the accuracy of the manufacturing process. Accordingly, when the two light emitting regions of B within the deposited region of the organic EL material of B are maximized (when an aperture ratio is prioritized), the light emitting regions of B become the shape as illustrated in FIG. 16.

A lower view of FIG. 16 is an enlarged view of four pixels of 2☐2. In order to maximize the light emitting regions of B, the light emitting regions of B in the upper right pixel and the lower left pixel of the four pixels are expanded to the lower side. As a result, the central positions thereof move to the lower side (in a direction being close to the light emitting regions of G having the highest luminosity factor), and the intervals between the central positions of the light emitting regions of B and the central positions of the light emitting regions of G in the column direction become r1. Meanwhile, in order to maximize the light emitting regions of B, the light emitting regions of B in the upper left pixel and the lower right pixel are expanded to the upper side. As a result, the central positions thereof move to the upper side (in a direction away from the light emitting regions of G), and the intervals between the central positions of the light emitting regions of B and the central positions of the light emitting regions of G in the column direction become r2 which is larger than the r1. Note that a distance "a" between an upper end of the deposited region of the organic EL material of B and the boundary of the upper pixel is equal to a distance "a" between the lower end thereof and the boundary of the lower pixel.

Herein, in the conventional pixel arrangement structure illustrated in FIG. 8, as illustrated in the lower view of FIG. 8, both of the upper pixels have intervals of r1 between the central positions of the light emitting regions of B and the central positions of the light emitting regions of G in the column direction, and both of the lower pixels have intervals of r2 between the central positions of the light emitting regions of B and the central positions of the light emitting regions of G in the column direction, which are larger than the r1. Therefore, the deviation in the distribution of the luminosity factor in the lower pixel having the large interval is increased, and thereby the coloring significantly appears when the lower pixels become the edge of the display image, and the display quality is significantly deteriorated. Compared to this, in the pixel arrangement structure of the present embodiment, the pixels having the large interval are not continuous, and the pixels having the large interval and the pixels having the small interval alternately appear. Therefore, the deviation in the distribution of the luminosity factor may be averaged, and as a result, an occurrence of the coloring may be controlled to improve the display quality.

By employing the pixel arrangement structure of FIG. 16, it is possible to control an occurrence of the coloring compared to the conventional structure. In addition, by controlling the size or the position of the light emitting regions of B, it is possible to further control an occurrence of the coloring.

FIG. 17 is an example in the case of controlling the size of the light emitting regions of B. For example, as illustrated in FIG. 17, the size of the respective light emitting regions of B is decreased, without changing the size of the deposited regions of the organic EL material of B, so that the intervals in the column direction between the central position of the light emitting regions of B and the central position of the light emitting regions of G in the upper and lower pixels adjacent to each other in the column direction are close to each other (i.e. by prioritizing the symmetry of the upper and lower pixels adjacent to each other in the column direction). In this case, as illustrated in the lower view of FIG. 17, intervals r1' between the central positions of the light emitting regions of B and the central positions of the light emitting regions of G in the column direction of the upper right pixel and the lower left pixel of the four pixels, and intervals r2' between the central positions of the light emitting regions of B and the central positions of the light emitting regions of G in the column direction of the upper left pixel and the lower right pixel are substantially equal to each other. Accordingly, a difference (r2'−r1') between the interval r1' and the interval r2' may be smaller than the difference (r2−r1) between the interval r1 and the interval r2 of FIG. 16, thereby further controlling an occurrence of the coloring. In the case of this structure, if the light emitting regions of B are decreased, the lifespan of the display apparatus is shortened. Therefore, a degree of priority for the symmetry (a degree of decrease in the size of the light emitting regions of B) may be appropriately set in consideration of the degree of the coloring. Note that a distance "a" between an upper end of the deposited region of the organic EL material of B and the boundary of the upper pixel is equal to a distance "a" between the lower end thereof and the boundary of the lower pixel.

FIG. 18 is an example in the case of controlling the positions of the light emitting regions of B. For example, as illustrated in FIG. 18, the positions of the light emitting regions of B are shifted to the lower side, without changing the size of the deposited regions of the organic EL material of B. Specifically, as illustrated in the lower view of FIG. 18, a distance a1 between an upper end of the deposited region of the organic EL material of B and the boundary of the upper pixel is larger than a distance a2 between the lower end thereof and the boundary of the lower pixel. In this case, in the upper right pixel and the lower left pixel of the four pixels, the centers of the light emitting regions of B move downward, and intervals r1" between the central positions of the light emitting regions of B and the central positions of the light emitting regions of G in the column direction are smaller than the r1 of FIG. 16. In addition, also in the upper left pixel and the lower right pixel, intervals r2" between the central positions of the light emitting regions of B and the central positions of the light emitting regions of G in the column direction are smaller than the r2 of FIG. 16. Accordingly, since both of the interval r1" and the interval r2" are smaller than the interval r1 and the interval r2 of FIG. 16, it is possible to further control an occurrence of the coloring.

In the case of this structure, since the light emitting regions of B are shifted to cause a deviation in the distribution of the luminosity factor, a degree of the shift for the positions of the light emitting regions of B may be appropriately set in consideration of the degree of the coloring.

Further, in FIGS. 16 to 18, the intervals between the central positions of the light emitting regions of B and the central positions of the light emitting regions of G in the upper and lower pixels adjacent to each other in the column direction are compared, but the intervals between the central positions of the light emitting regions of B and the centers of the pixels (the central positions of the light emitting regions of RGB) may be compared. In addition, the size of the light emitting regions of B is controlled in FIG. 17, and the position of the light emitting regions of B is controlled in FIG. 18, but it may have a pixel arrangement structure in which a difference between the interval r2 and the interval r1 is decreased, or both the interval r2 and the interval r1 are decreased.

As described above, the organic EL display apparatus of the present embodiment comprises a plurality of first pixels provided with sub-pixels of three colors and a plurality of second pixels provided with sub-pixels of the three colors in an array different from an array of the sub-pixels of the first pixels. The first pixels and the second pixels have a rectangular shape, respectively.

The first pixels and the second pixels are disposed so as to alternate with each other in the row direction and the column direction. Also, within the first pixel and the second pixel, a sub-pixel of a first color and a sub-pixel of a second color out of the sub-pixels of three colors are disposed in a first column direction, and a sub-pixel of a third color out of the sub-pixels of three colors is disposed in a second column direction next to the first column direction. Moreover, within the first pixel, the sub-pixel of the third color is shifted toward a side of the sub-pixel of the first color, and within the second pixel, the sub-pixel of the third color is shifted toward a side of the sub-pixel of the second color. Note that the first color is green, the second color is red, and the third color is blue, for example.

Example 1

Next, a display device and an electro-optical device according to a first example will be described with reference to FIGS. 19 to 35.

In the above-described embodiment, the electro-optical device (organic EL display apparatus) has been described paying attention to the pixel arrangement structure thereof, but in the present example, a method of manufacturing an organic EL display apparatus including the pixel array of the pixel arrangement structure will be described. Further, FIGS. 19, 21, 23 and 25 are plan views of one set of the pixels of the pixel arrangement structure of FIG. 18, respectively, and FIGS. 20, 22, 24 and 26 are cross-sectional views of a TFT unit, a holding capacitor unit and a light emitting element highlighting one sub-pixel, respectively.

Figure 19:
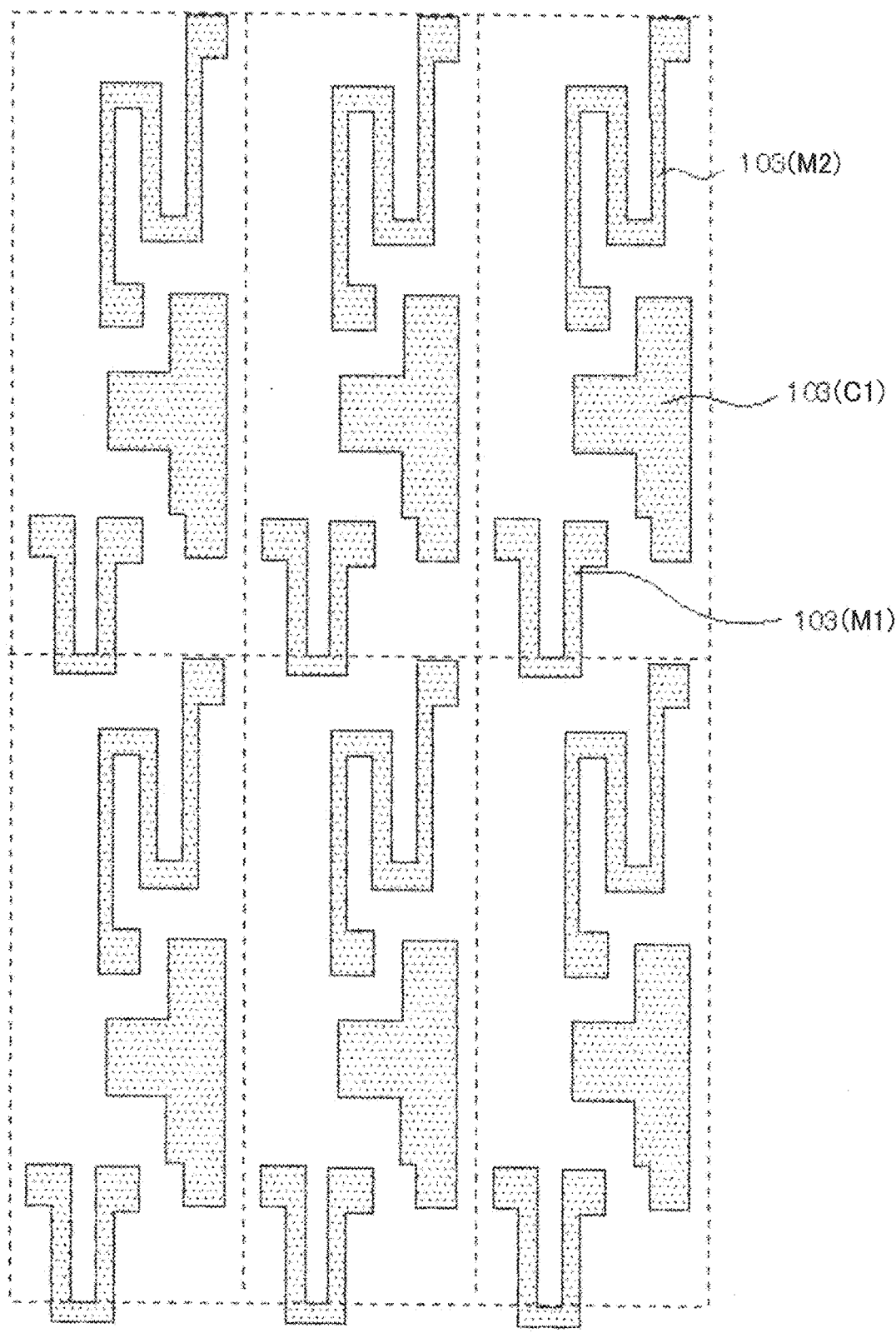
FIG. 19 is a plan view describing a manufacturing process (first process) of the organic EL display apparatus according to a first example.
Figure 20:
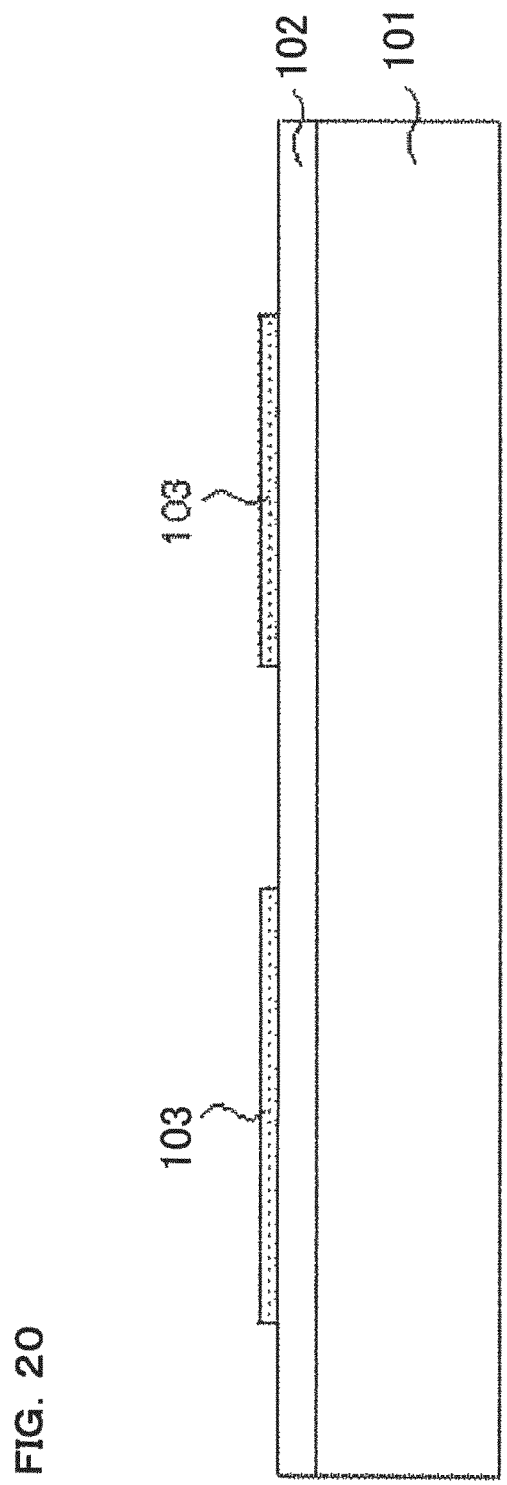
FIG. 20 is a cross-sectional view describing the manufacturing process (first process) of the organic EL display apparatus according to the first example.

First, as illustrated in FIGS. 19 and 20, for example, a silicon nitride film, etc. is deposited on a transparent substrate (glass substrate 101) such as a glass by a chemical vapor deposition (CVD) method, etc. to form an underlying insulation film 102. Next, the TFT unit and the holding capacitor part are formed using a known low-temperature polysilicon TFT fabrication technique. Specifically, amorphous silicon is deposited by the CVD method, etc., and is crystallized by excimer laser annealing (ELA) to form a polysilicon layer 103. In this regard, in order to control the variations in an output current by sufficiently securing the channel length of an M2 driving TFT used as a voltage-current conversion amplifier, and enable connection of the source of an M1 switch TFT with a data line 107a, connection of the drain of the M1 switch TFT with a C1 holding capacitor, connection of the C1 holding capacitor with a power supply line 107b, connection of the source of the M2 driving TFT with the power supply line 107b, and connection of the drain of the M2 driving TFT with an anode electrode 111 of each sub-pixel, the polysilicon layers 103 are routed as illustrated in FIG. 19.

Figure 21:
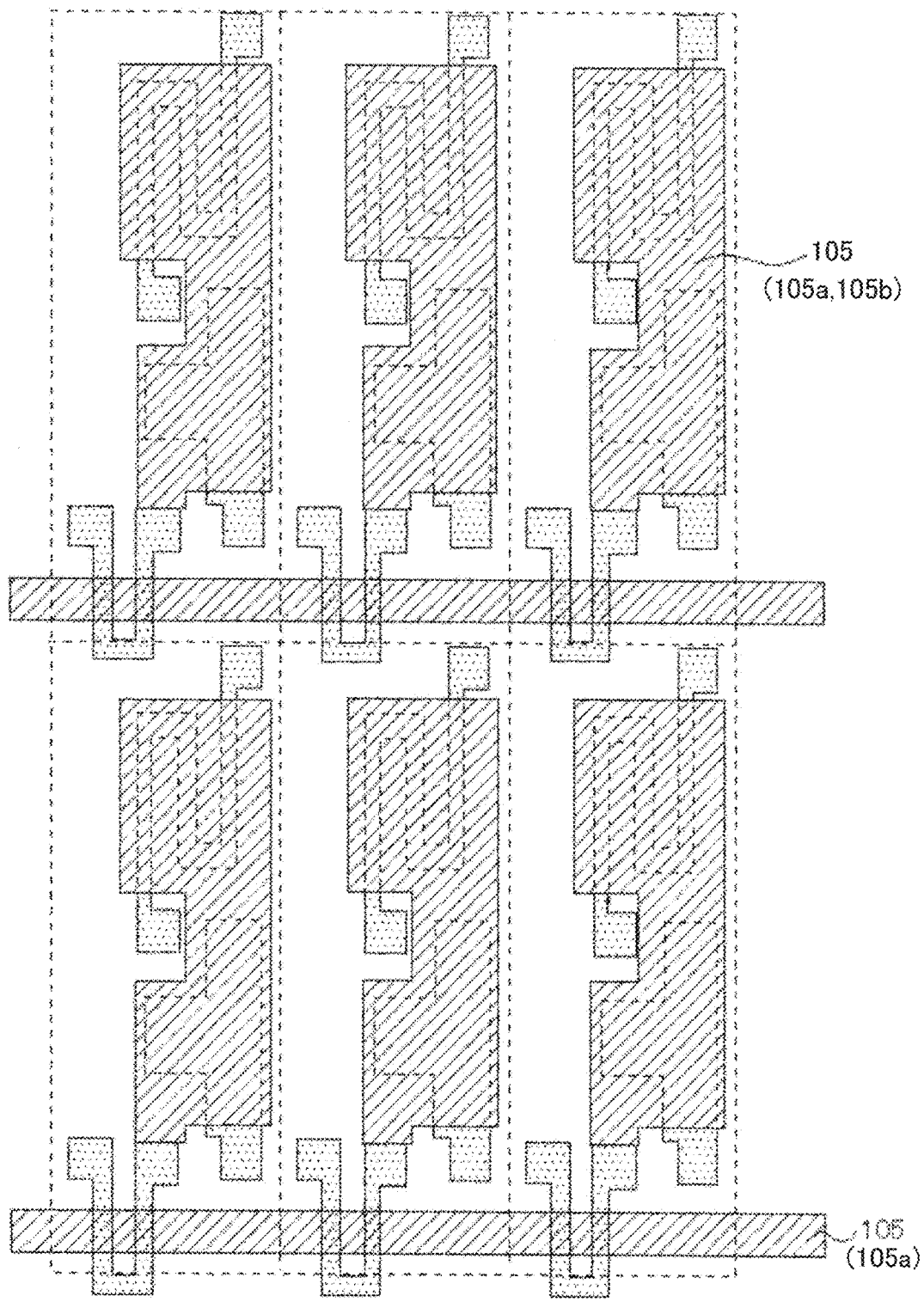
FIG. 21 is a plan view describing a manufacturing process (second process) of the organic EL display apparatus according to the first example.
Figure 22:
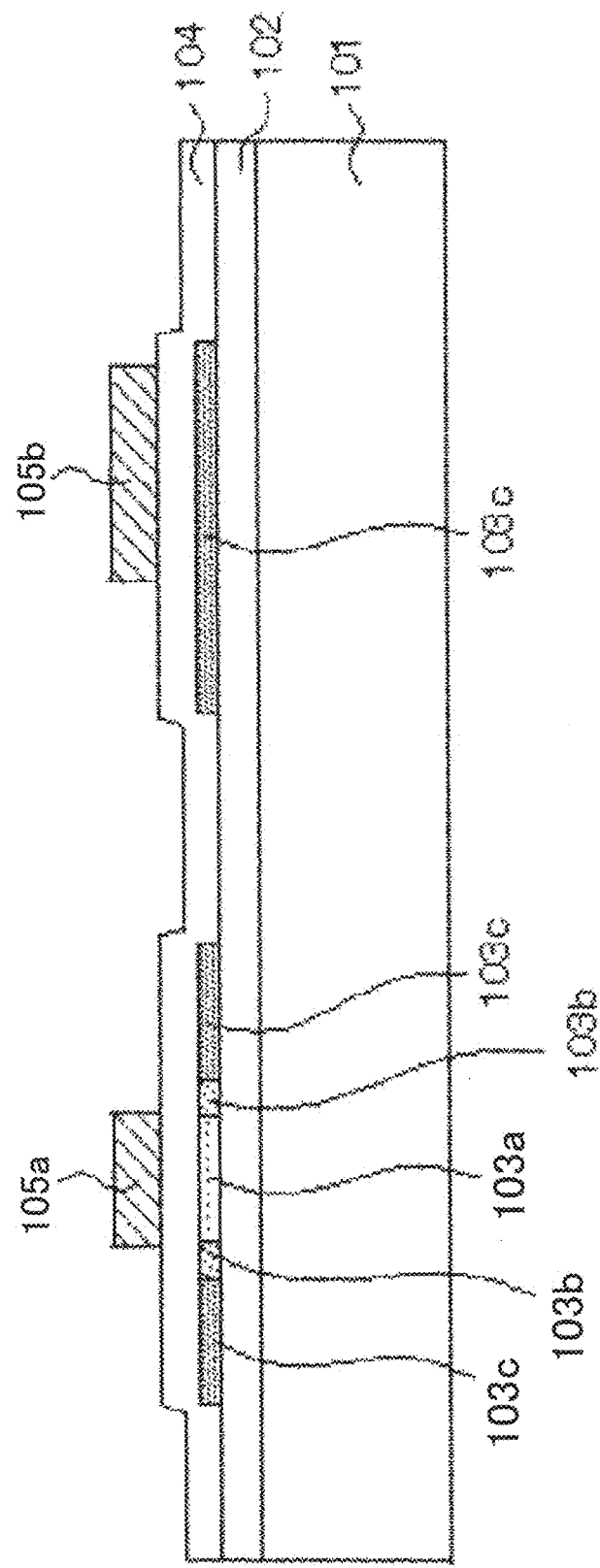
FIG. 22 is a cross-sectional view describing the manufacturing process (second process) of the organic EL display apparatus according to the first example.

Next, as illustrated in FIGS. 21 and 22, for example, a silicon oxide film, etc. is deposited on the polysilicon layer 103 (an i layer 103a, a p– layer 103b, and a p+ layer 103c) by the CVD method, etc. to form a gate insulation film 104, and further, an alloy of molybdenum (Mo), niobium (Nb), and tungsten (W), etc. as the first metal layer 105 is deposited thereon by a sputtering method, etc. to form a gate electrode 105a and a holding capacitor electrode 105b. In addition, in the present example, in order to connect the power supply lines 107b formed by a second metal layers 107 to be described below, power supply lines extending in a direction of the gate electrode 105a are formed on the same layer as the gate electrode 105a. Furthermore, the first metal layers 105 may be formed in a single layer made of one material selected from a group consisting of Mo, W, Nb, MoW, MoNb, Al, Nd, Ti, Cu, Cu alloy, Al alloy, Ag, and Ag alloy, etc., or in order to reduce the wiring resistance, may be formed in one laminate structure selected from a group consisting of a two-layer structure or a multi-layer structure of two or more of Mo, Cu, Al or Ag being low resistive material. In this regard, in order to increase the holding capacitance in each sub-pixel, and easily connect the drain of the M1 switch TFT with the holding capacitor electrode 105b in each sub-pixel, the first metal layers 105 are formed in a shape as illustrated in FIG. 21. Then, by performing additional impurity doping using the gate electrode 105a as a mask on the polysilicon layer 103 on which a high concentration impurity layer (the p+ layer 103c) is doped before forming the gate electrode, a low concentration impurity layer (the p– layer 103b) is formed, such that a lightly doped drain (LDD) structure is formed in the TFT unit.

Figure 23:
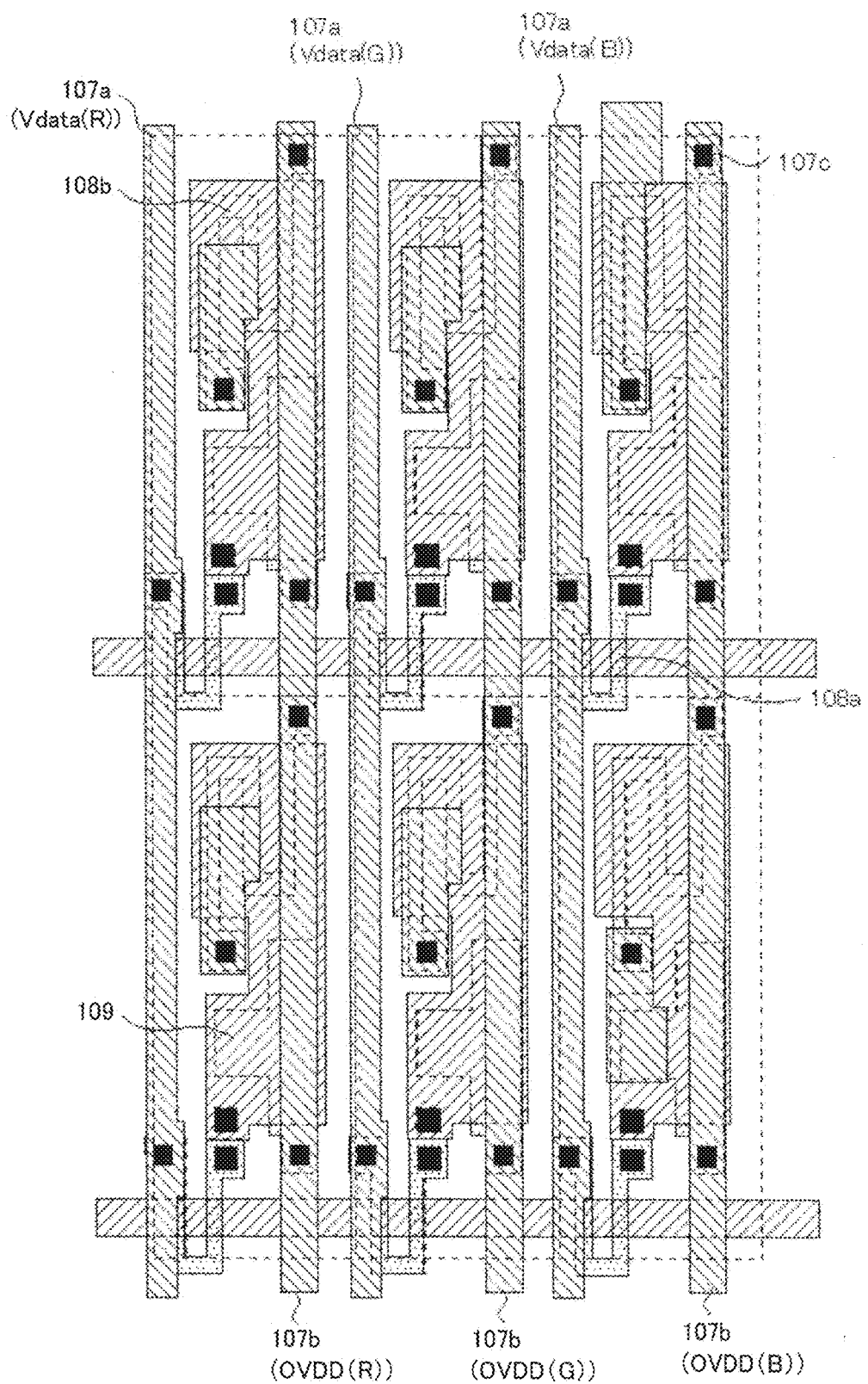
FIG. 23 is a plan view describing a manufacturing process (third process) of the organic EL display apparatus according to the first example.
Figure 24:
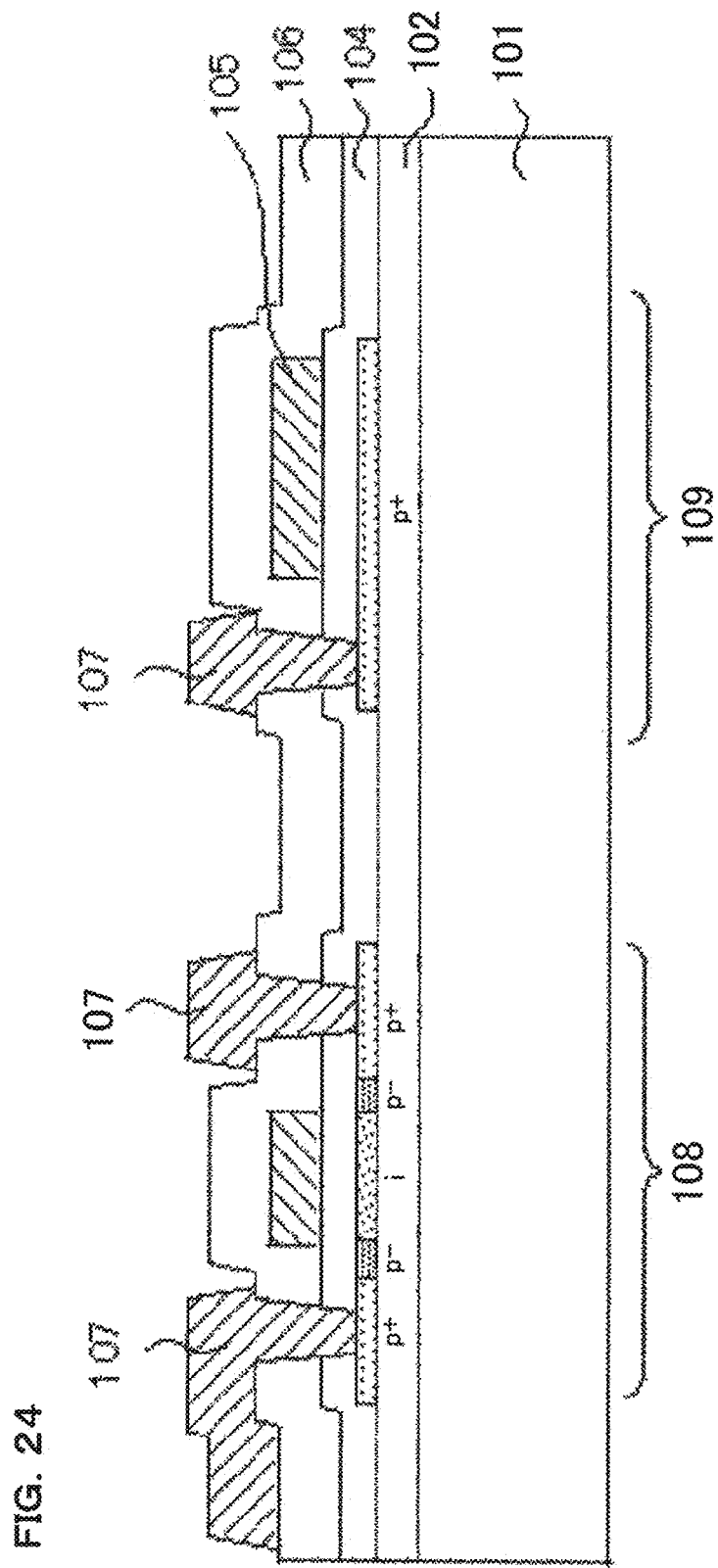
FIG. 24 is a cross-sectional view describing the manufacturing process (third process) of the organic EL display apparatus according to the first example.

Next, as illustrated in FIGS. 23 and 24, for example, a silicon oxide film, etc. is deposited thereon by the CVD method, etc. to form an interlayer insulation film 106. Anisotropic etching is performed on the interlayer insulation film 106 and the gate insulation film 104 to open contact holes for connecting with the polysilicon layer 103 and contact holes for connecting with the power supply lines of the first metal layers 105. Then, for example, second metal layers 107 of aluminum alloy such as Ti/Al/Ti, etc. are deposited by the sputtering method, etc., and patterning thereof is performed to form the source/drain electrodes, the data lines 107a, the power supply lines 107b, and the first contact parts 107c (a rectangular portion of black). In this case, the power supply lines 107b are formed in a linear shape, and connected to predetermined power supply lines of the first metal layers 105 through the first contact parts 107c. In addition, the power supply line 107b of B has a width wider than that of the power supply lines 107b of R and G. Further, the data lines 107a are formed in a routing shape so as to be disposed on the right side or the left side of the sub-pixels for each row. Thereby, the data line 107a and the source of the M1 TFT switch are connected with each other, the drain of the M1 switch TFT and the holding capacitor electrode 105b and the gate of the M2 driving TFT are connected with each other, and the source of the M2 driving TFT and the power supply line 107b are connected with each other.

Figure 25:
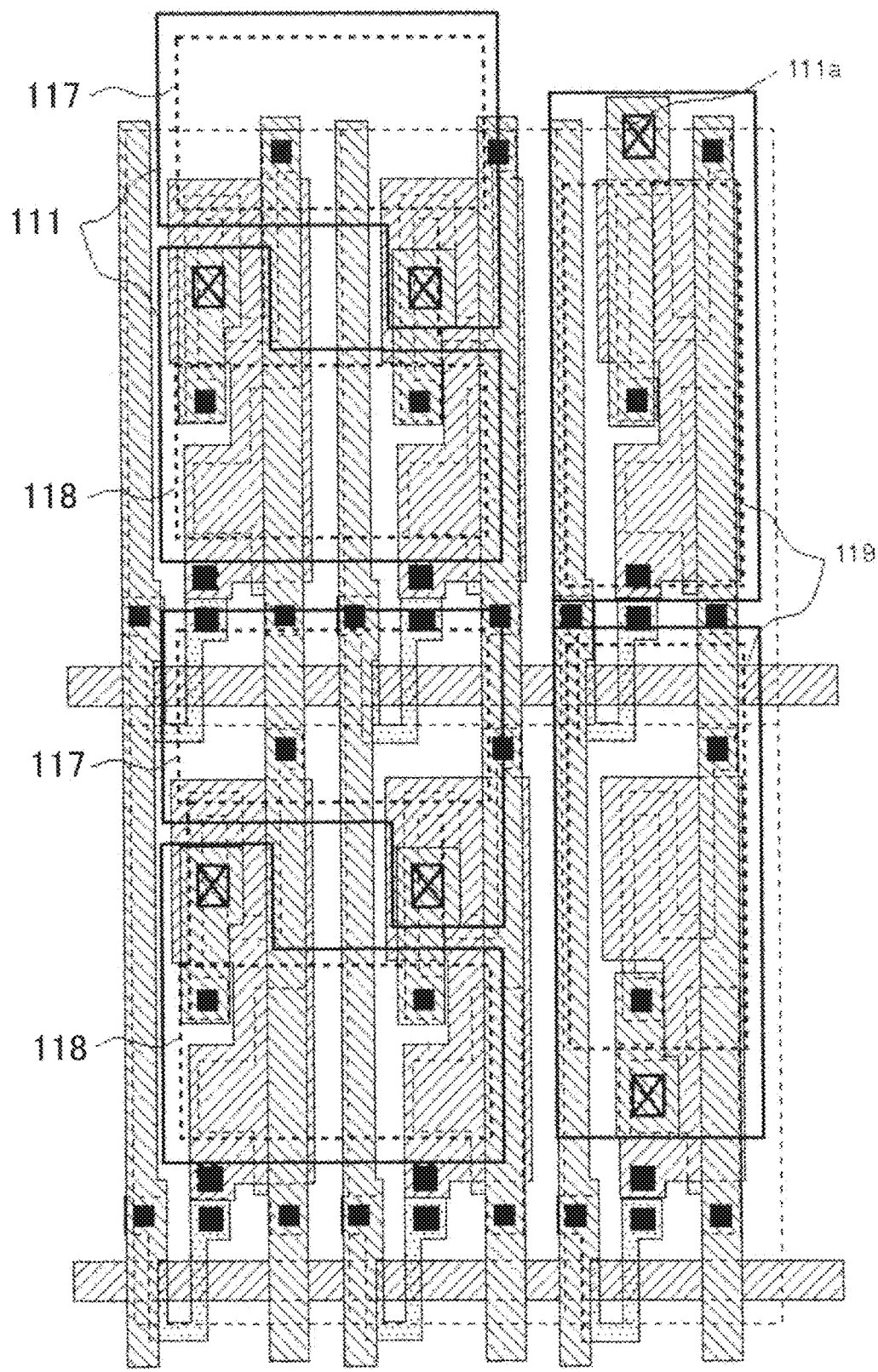
FIG. 25 is a plan view describing a manufacturing process (fourth process) of the organic EL display apparatus according to the first example.
Figure 26:
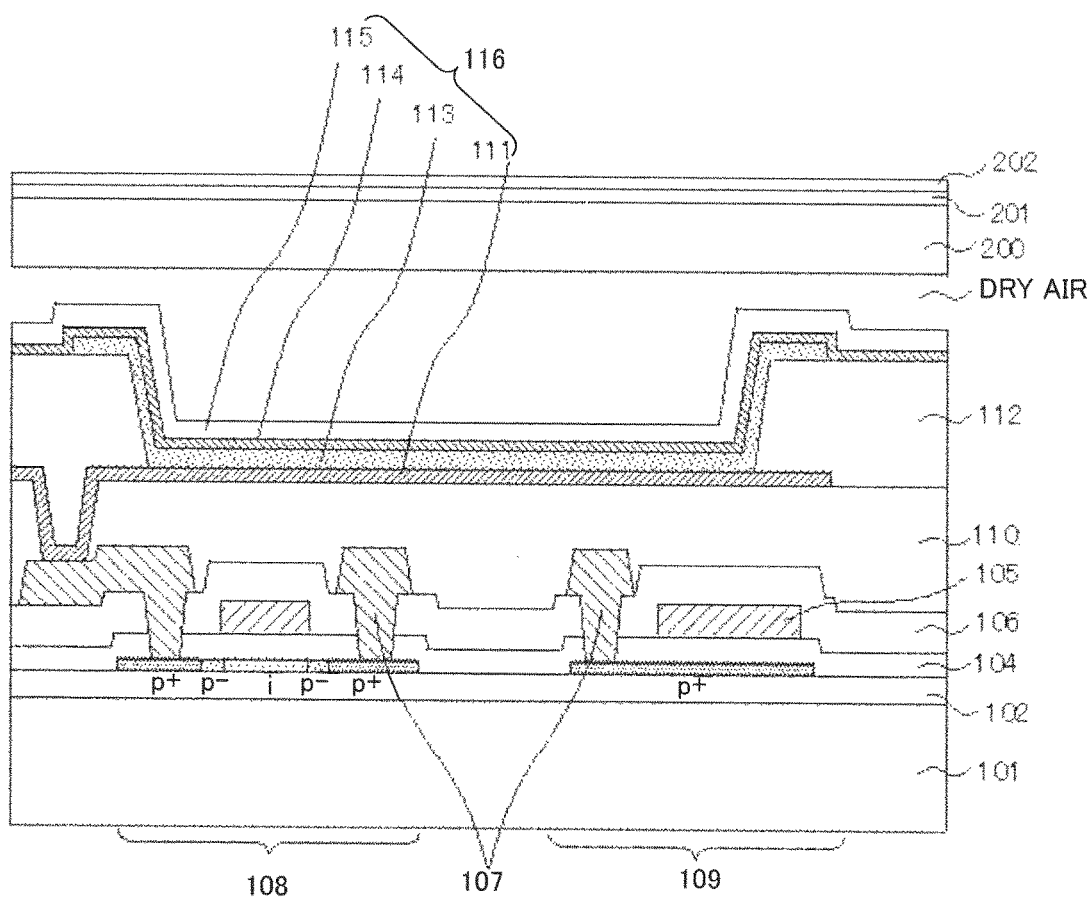
FIG. 26 is a cross-sectional view describing the manufacturing process (fourth process) of the organic EL display apparatus according to the first example.

Next, as illustrated in FIGS. 25 and 26, a flattened film 110 is formed by depositing a photosensitive organic material. Then, a taper angle is controlled by optimizing the exposure conditions, such that contact holes (thick solid line portions denoted by x marks) are opened for connecting with the drains of the M2 driving TFTs. The openings of the contact holes are formed at the line symmetric positions with respect to the center line of the two sub-pixels of B. A reflection film of Ag, Mg, Al, Pt, Pd, Au, Ni, Nd, Ir, Cr and a compound metal thereof is deposited thereon, and then, a transparent film such as ITO, IZO, ZnO or $In_2O_3$, etc. is deposited thereon and simultaneously patterned, to form the anode electrode 111 of each sub-pixel. The anode electrode 111 is connected with the drain of the M2 driving TFT at the second contact part 111a. Further, in the case of the top-emission structure, the anode electrode 111 requires a reflection film to function as a reflection film, but in the case of the bottom-emission structure, the reflection film is eliminated, and only the transparent film such as ITO is formed. Thereafter, for example, a photosensitive organic resin film is deposited by a spin coating method, etc. to form an element separation film 112, and patterning thereof is performed to form an element isolation layer to which the anode electrode 111 of each sub-pixel is exposed to the bottom. The light emitting regions of each sub-pixel are separated from each other by the element isolation layer.

Figure 27:
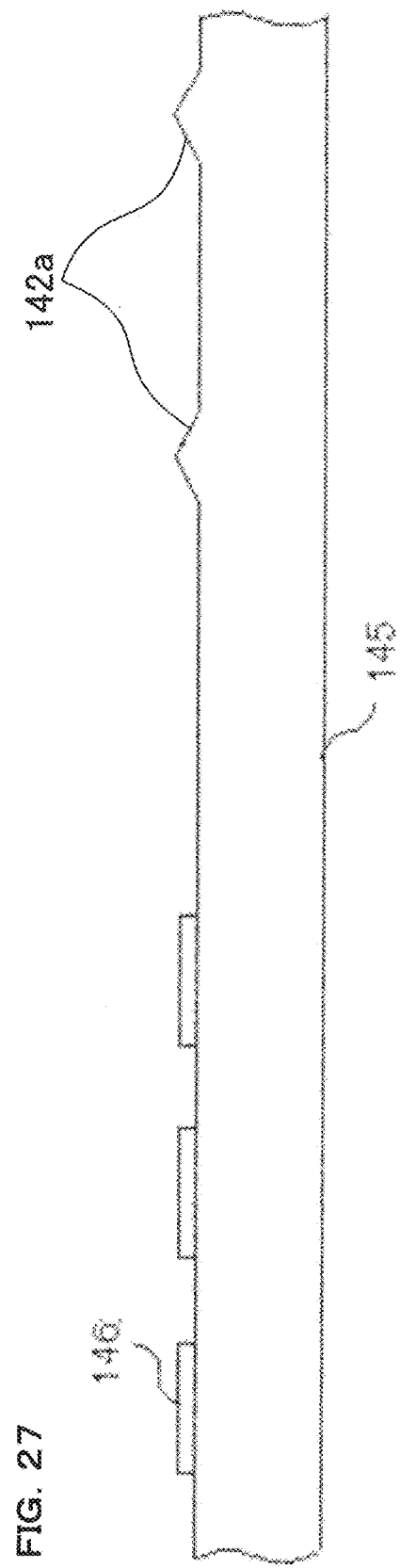
FIG. 27 is a cross-sectional view schematically illustrating a method of manufacturing a metal mask according to the first example.
Figure 28:
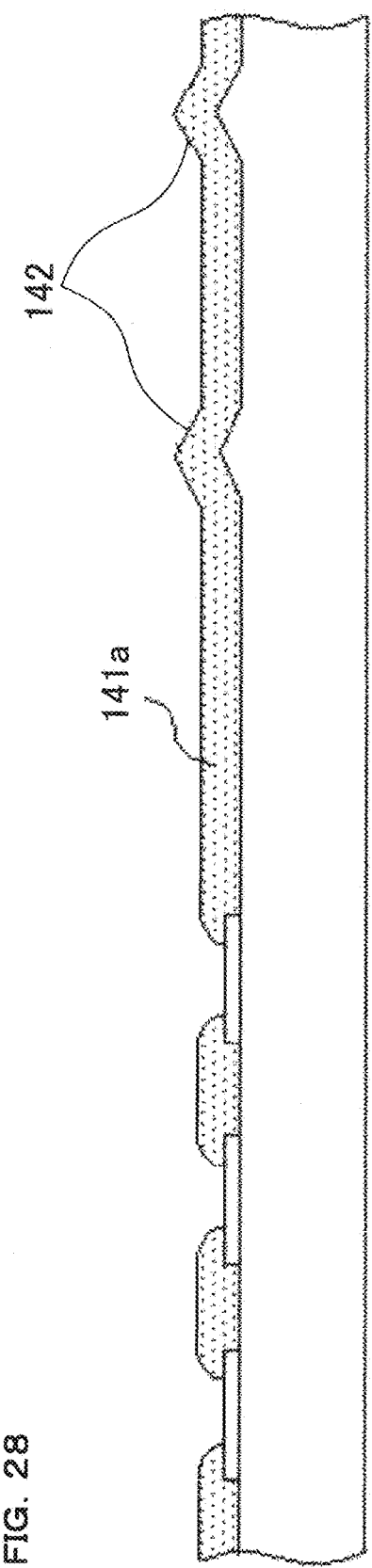
FIG. 28 is a cross-sectional view schematically illustrating the method of manufacturing the metal mask according to the first example.
Figure 29:
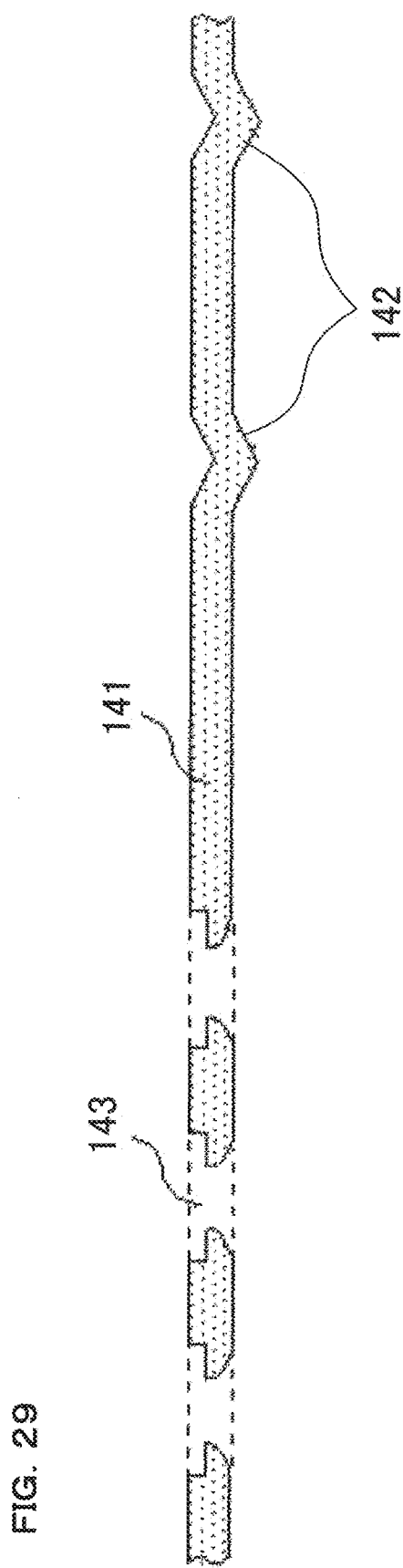
FIG. 29 is a cross-sectional view schematically illustrating the method of manufacturing the metal mask according to the first example.
Figure 30:
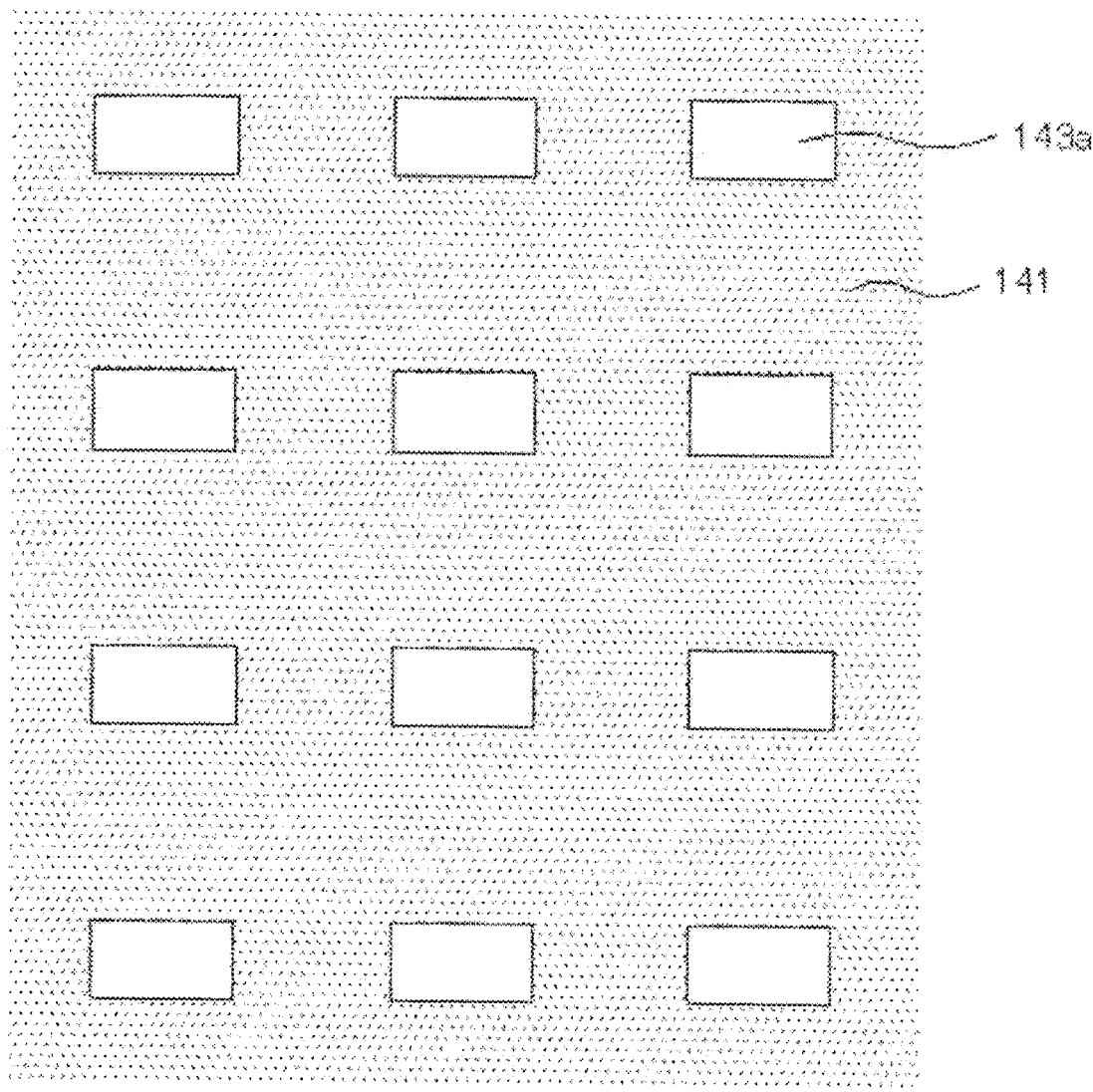
FIG. 30 is a plan view schematically illustrating a configuration of the metal mask (a configuration of R opening parts) according to the first example.
Figure 31:
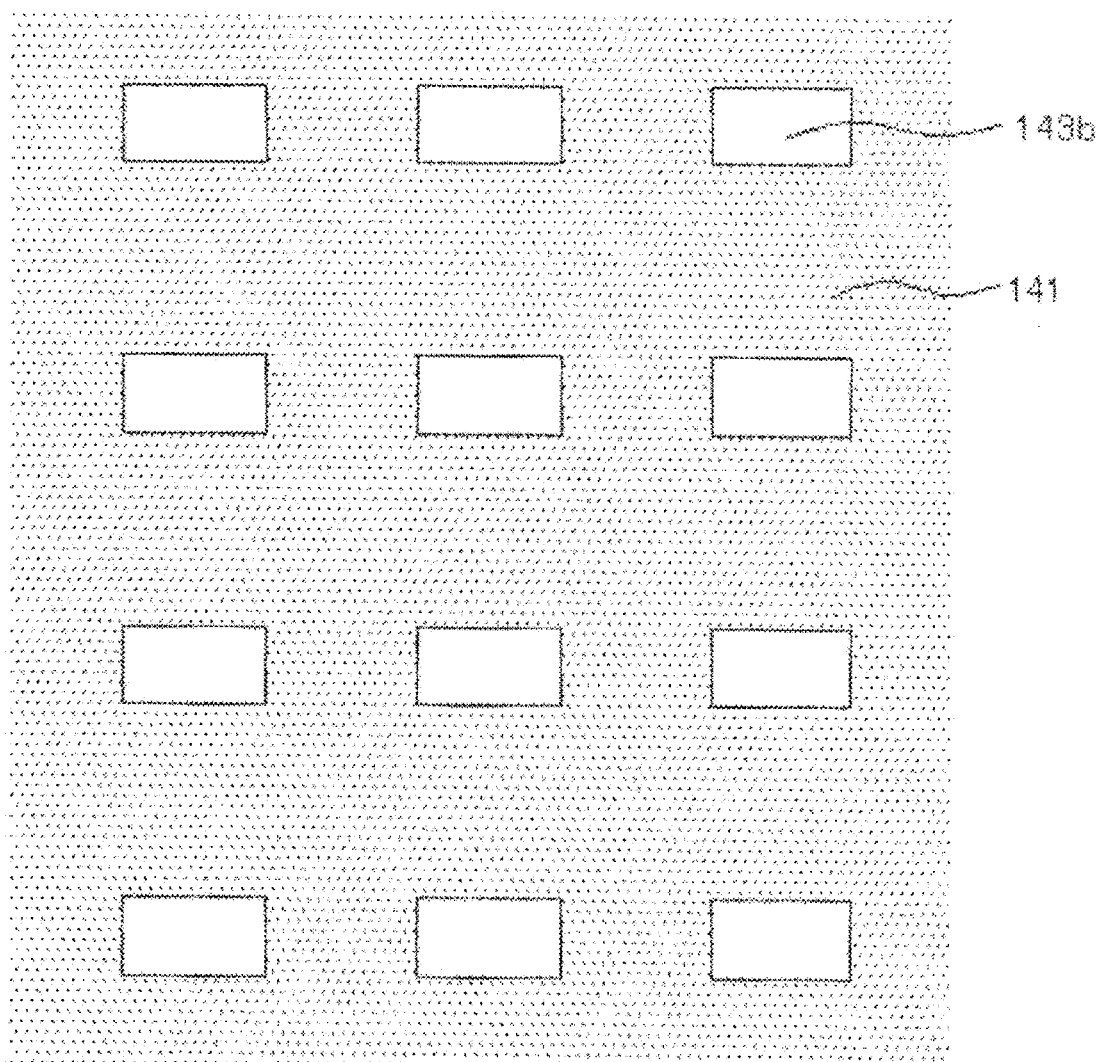
FIG. 31 is a plan view schematically illustrating a configuration of the metal mask (a configuration of G opening parts) according to the first example.
Figure 32:
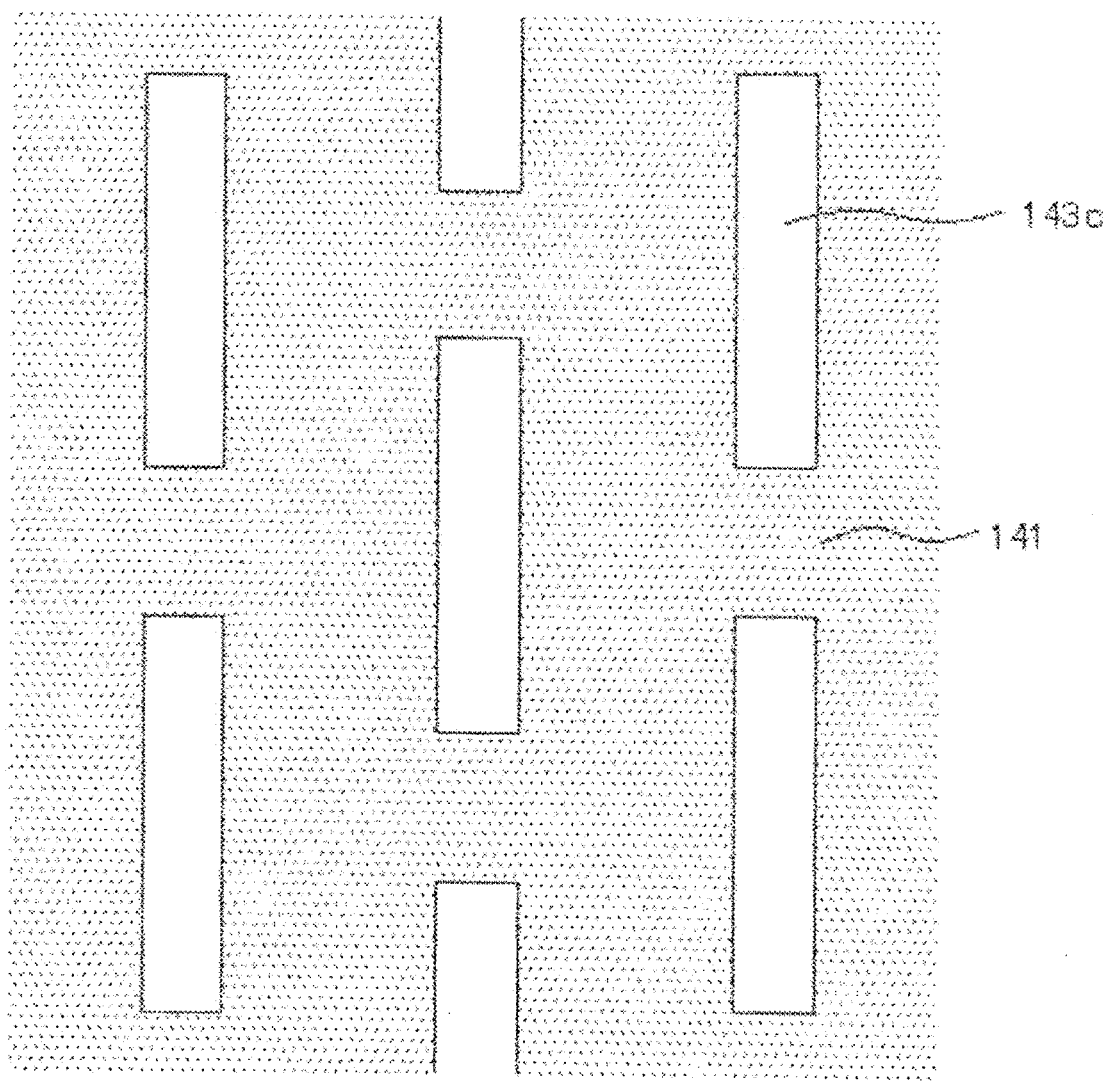
FIG. 32 is a plan view schematically illustrating a configuration of the metal mask (a configuration of B opening parts) according to the first example.
Figure 33:
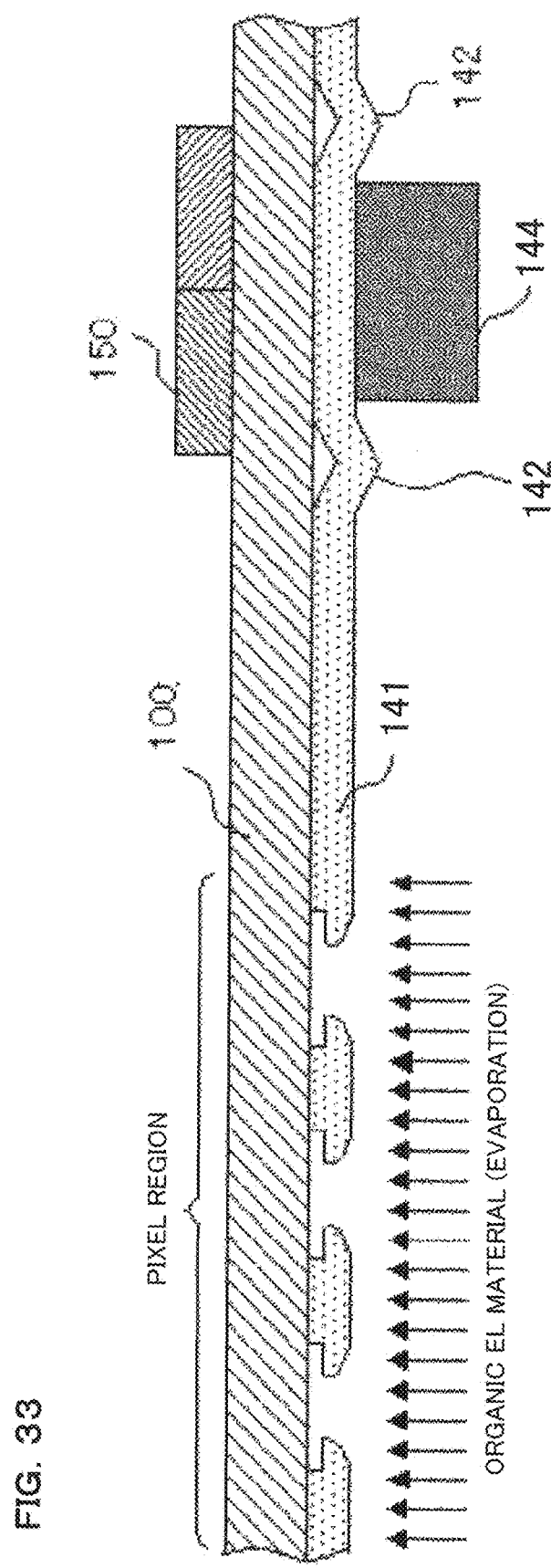
FIG. 33 is a cross-sectional view schematically illustrating a method of depositing the organic EL material using the metal mask according to the first example.
Figure 34:
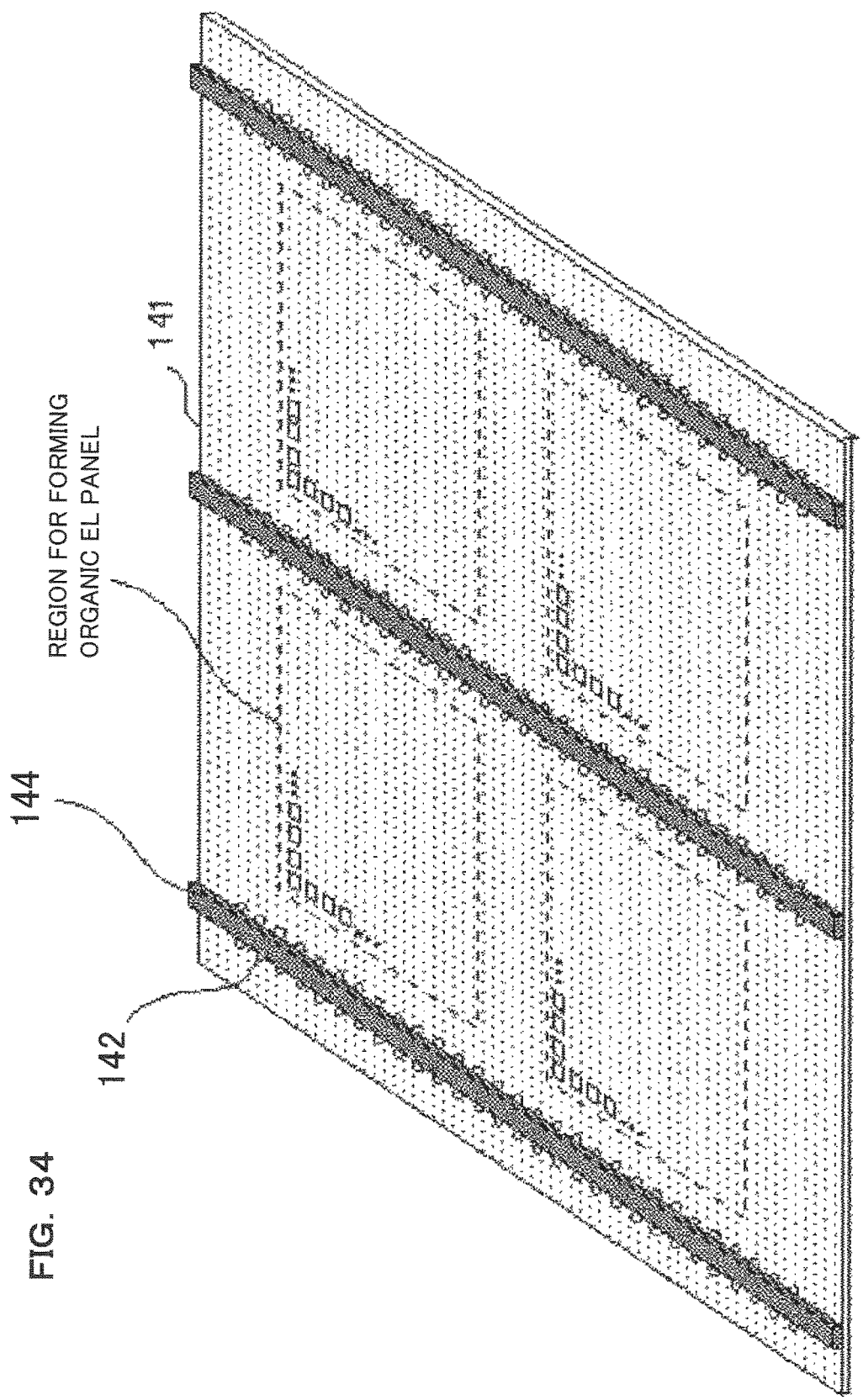
FIG. 34 is a perspective view illustrating a positional relation between a metal mask body and reinforcing members according to the first example.
Figure 35:
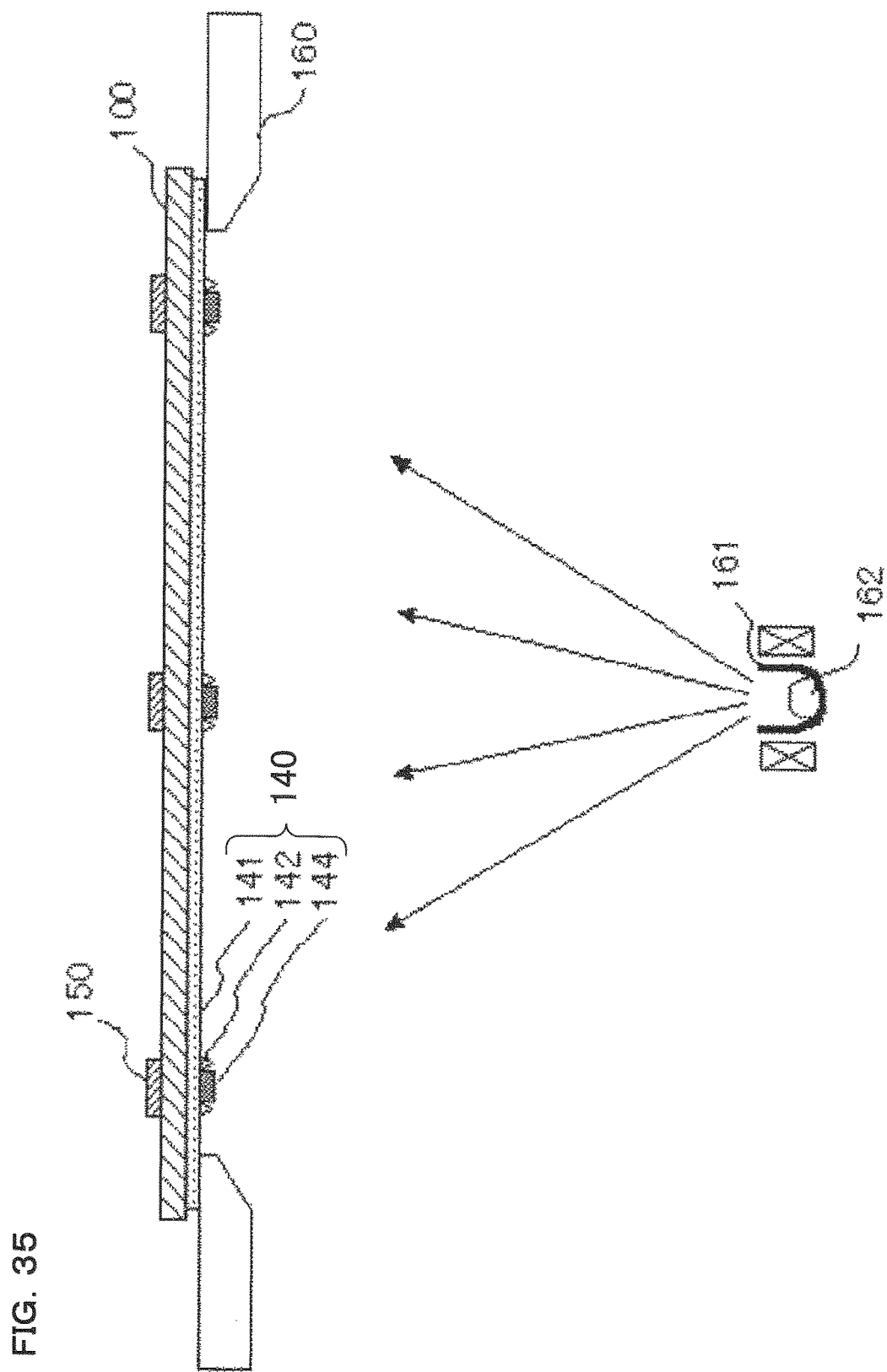
FIG. 35 is a cross-sectional view schematically illustrating the method of depositing the organic EL material using the metal mask according to the first example.

Next, an organic EL material is deposited on the glass substrate 101 with the element separation film 112 formed thereon. FIGS. 27 to 29 are views describing a method of manufacturing a metal mask used during depositing the organic EL material, and illustrate the region in the vicinity of an end part of the organic EL panel. In addition, FIGS. 30 to 32 are plan views illustrating a part of the metal mask for depositing the organic EL material of each color, FIGS. 33 and 35 are cross-sectional views schematically illustrating a method of depositing the organic EL material using the metal mask, and FIG. 34 is a perspective view illustrating a positional relation between a metal mask body and a reinforcing member.

First, a method of manufacturing a metal mask will be described. A metal mask 140 may also be manufactured by forming opening parts in portions corresponding to the sub-pixels of a thin plate-shaped metal mask member by die cutting or etching, but herein, it will be described using a plating method. Specifically, as illustrated in FIG. 27, a base material (a base material 145 for electroforming) for plating-growth of the metal mask body is prepared. A material of the base material 145 for electroforming is not particularly limited, but at least, a material (for example, a glass material or alumite, etc.) which has electrical conductivity (which is unnecessary for electroless plating) that can apply a current for electrolytic plating, and which may be formed by a method such as cutting or etching of convexes and concaves may be used.

Then, protrusions 142a are formed on portions (i.e. portions outside of the pixel region of the organic EL panel) to be formed as guide parts 142, and as necessary, graphite or a conductive adhesive, etc. to facilitate the peeling off of a metal mask member 141a is applied or a coating film is subjected to plating-growth to form an underlying layer, then photoresist is applied on an entire surface of the base material 145 for electroforming, and exposure and development are performed so as to leave photoresists 146 on portions corresponding to the sub-pixels in each pixel. In this regard, in order to grow the metal mask member 141*a* grown from the base material 145 for electroforming so as to cover the photoresists 146 during plating, the size of a photoresist pattern is determined, and the thickness of the photoresists 146 or conditions for plating-growth are set, in consideration of an amount covering the photoresists 146.

Next, the base material 145 for electroforming with the photoresists 146 formed thereon is immersed in an electrolytic solution. In the case of electrolytic plating, by applying a predetermined current, as illustrated in FIG. 28, the metal mask member 141*a* having a predetermined thickness is grown on the base material 145 for electroforming. The metal mask member 141*a* may be made of, for example, nickel, a nickel alloy, a nickel-cobalt alloy, a nickel-iron alloy such as Invar or the like. Further, during plating-growth of the metal mask member 141*a*, as illustrated in Japanese Patent Laid-Open Publication No. 2005-206881, it is also possible to use a method of forming a first metal to the thickness of the photoresist, and forming a second metal thereon or the like.

After the plating growth, the base material 145 for electroforming with the metal mask member 141*a* grown thereon is immersed in predetermined peeling liquid (for example, acetone or methyl chloride, etc.), such that the metal mask member 141*a* together with the photoresists 146 is separated from the base material 145 for electroforming, so as to complete a metal mask body 141 of the metal mask 140 in which opening parts 143 corresponding to the sub-pixels and the guide parts 142 are formed, as illustrated in FIG. 29. FIG. 30 is an example of the metal mask body 141 in which R opening parts 143*a* corresponding to the sub-pixels of R are formed, FIG. 31 is an example of the metal mask body 141 in which G opening parts 143*b* corresponding to the sub-pixels of G are formed, and FIG. 32 is an example of the metal mask body 141 in which B opening parts 143*c* corresponding to the sub-pixels of B are formed. In the present example, in order to form the opening parts in the sub-pixels of B over the two pixels vertically adjacent to each other in the column direction, the B opening parts 143*c* have a size larger than that of the R opening parts 143*a* and the G opening parts 143*b*. However, since the B opening parts 143*c* are obliquely formed by shifting one row in the even row and the odd row, and the edges of the opening parts are not formed in one straight line with respect to the row direction (a horizontal direction of FIG. 32), it is possible to control a deformation of the metal mask.

Thereafter, as illustrated in FIGS. 33 to 35, reinforcing members 144 having predetermined characteristics (strength, heat expansion rate and magnetism) are disposed so as to align with portions defined by the guide parts 142 of the metal mask body 141, the metal mask body 141 with the reinforcing members 144 disposed thereon is disposed so as to align with a surface (a deposition surface on which the opening parts are formed by removing the element separation film 112) of the TFT substrate 100, and fixing members 150 such as a magnet are disposed at the positions facing the reinforcing members 144 of the rear surface of the TFT substrate 100, such that the metal mask 140 is fixed to the TFT substrate 100. Then, the TFT substrate 100 is set on a stage 160 in a vacuum chamber of an evaporation apparatus with the front surface thereof facing down, and an organic EL material as an evaporation material 162 is vaporized by heating a crucible 161, so as to evaporate the organic EL material on the positions corresponding to the respective sub-pixels of the TFT substrate 100 through the opening parts 143 of the metal mask body 141. The reinforcing members are disposed at middle parts of adjacent organic EL panel forming regions. Since the opening pattern is not disposed at the middle parts, the opening pattern is not affected by the reinforcing members. By employing the above-described structure, it is possible to control a deformation of the metal mask, and reduce time and costs required for mounting the metal mask, as well as, simply repair a position shift or warping of the metal mask.

Further, in the above description, the guide parts 142 are formed so that a surface of the metal mask body 141 on a side opposite to the TFT substrate 100 protrudes, but concave parts for guides may be formed so that the surface on the side opposite to the TFT substrate 100 is hollowed, and locked to convex parts provided on the reinforcing members 144. In addition, in the above description, the cross-sections of the reinforcing members 144 and the fixing members 150 are formed in a rectangular shape, but the cross-section shape is not limited to the configuration of FIG. 33, and for example, it may be formed in a trapezoidal shape or a semi-circular shape. Further, in order to prevent the metal mask body 141 from contacting the entire surface of the TFT substrate 100, it may be configured so that the convex parts protruding to the TFT substrate 100 side are formed at predetermined portions outside of the organic EL panel forming regions, and the metal mask body 141 contacts the TFT substrate 100 only by the convex parts. Further, in the above description, as an example of the method of manufacturing the metal mask body 141, it has been described using the plating method, but an etching method may also be used.

Referring again to FIGS. 25 and 26, organic EL materials are deposited for each color of RGB, and the organic EL layer 113 (light emitting layer) is formed on the anode electrode 111. In this regard, the organic EL materials of R and B are deposited over two sub-pixels laterally adjacent to each other, but since the anode electrode 111 of the respective colors is connected to the M2 switch TFT of each sub-pixel, there is no problem even when forming the organic EL layer 113 over pixels. In addition, the organic EL material of B is also deposited over two sub-pixels vertically adjacent to each other in the column direction, but since the anode electrodes 111 are separated from each other for each sub-pixel, and the organic EL material of the portion which has no anode electrode 111 does not emit light, there is no problem even when forming the organic EL layer 113 over pixels. The organic EL layer 113 includes, for example, a hole injection layer, a hole transport layer, a light emitting layer, an electron transport layer, an electron injection layer, and the like, which are sequentially formed form a lower layer side. Alternately, the organic EL layer 113 may be any structure of an electron transport layer/light emitting layer/hole transport layer, an electron transport layer/light emitting layer/hole transport layer/hole injection layer, an electron injection layer/electron transport layer/light emitting layer/hole transport layer, or the light emitting layer alone, or may include an electron blocking layer added thereto. The materials of the light emitting layer are different from each other for each color of the sub-pixels, and the thickness of the hole injection layer, the hole transport layer, and the like is controlled individually for each sub-pixel, as necessary.

Metal having a small work function, that is, any one of Li, Ca, LiF/Ca, LiF/Al, Al and Mg, or a compound thereof is evaporated on the organic EL layer 113 to form a cathode electrode 114. The thickness of the cathode electrode is optimized in order to secure a good viewing angle dependence by improving light extraction efficiency. If the resistance of the cathode electrode is high and uniformity of the light emission luminance is deteriorated, an auxiliary electrode layer is additionally formed thereon of a material for forming a transparent electrode such as ITO, IZO, ZnO or $In_2O_3$, etc. Further, in order to improve the light extraction efficiency, an insulation film having a refractive index higher than the glass is deposited thereon to form the cap layer 115. The cap layer also serves as a protective layer for the organic EL element.

By the above-described processes, the light emitting element 116 corresponding to each sub-pixel of RGB is formed, whereby portions in which the anode electrode 111 and the organic EL layer 113 are in contact with each other (opening portions of the element separation film 112) become a R light emitting region 117, G light emitting region 118, and B light emitting region 119, respectively.

Further, when the light emitting element 116 is formed in the bottom-emission structure, the cathode electrode 114 (transparent electrode such as ITO) may be formed on a flattened film 110, and the anode electrode 111 (a reflective electrode) may be formed on the organic EL layer 113. Since it is not necessary to extract the light from an upper surface in the bottom emission structure, a metal layer such as Al may be thickly formed, and since the resistance of the cathode electrode can be greatly decreased, it is suitable for an increase in size. However, since no light is transmitted through a TFT element and a wiring portion, the light emitting region becomes extremely small, such that it is not suitable for an increase in definition.

Next, the outer periphery of the TFT substrate 100 is applied with glass frit, a sealing glass substrate 200 is placed thereon, and the glass frit part is heated and melted using a laser beam or the like, such that the TFT substrate 100 and the sealing glass substrate 200 are hermetically bonded to each other. Thereafter, a λ/4 retardation plate 201 and a polarizing plate 202 are formed on the light emitting side of the sealing glass substrate 200, so as to complete the organic EL display apparatus.

Further, FIGS. 19 to 35 are an example of the method of manufacturing the organic EL display apparatus in the present example, and the manufacturing method thereof is not particularly limited so long as the pixel arrangement structure can be achieved as illustrated in the embodiment.

Example 2

Next, an electro-optical device and electric equipment according to a second example will be described with reference to FIGS. 36 to 39. In the present example, as applications of an organic EL display apparatus, various electric equipment comprising the organic EL display apparatus as a display means will be described.

Figure 36:
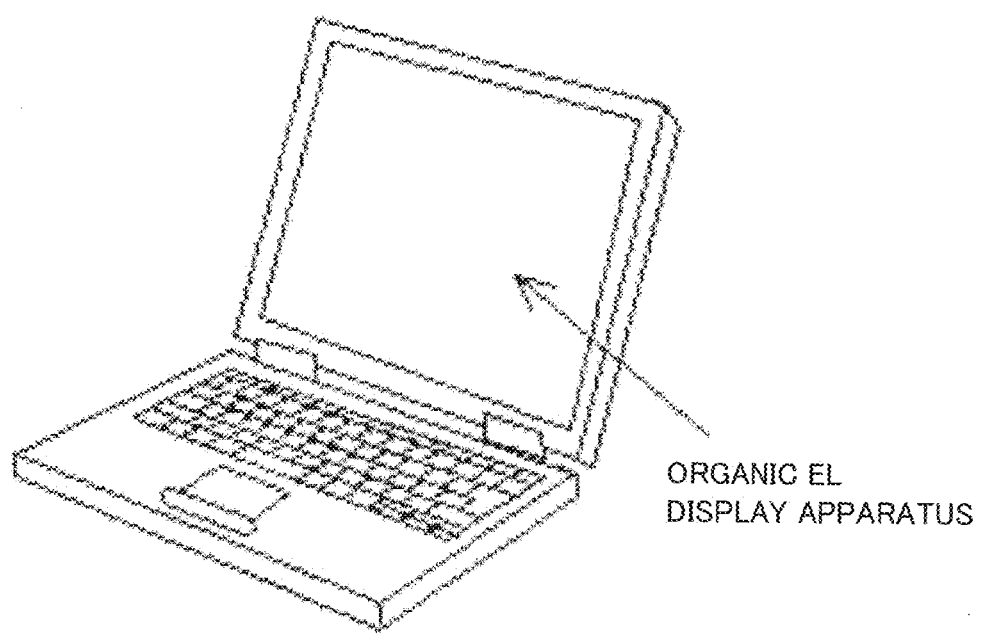
FIG. 36 is a schematic view illustrating an application of an organic EL display apparatus according to a second example.
Figure 37:
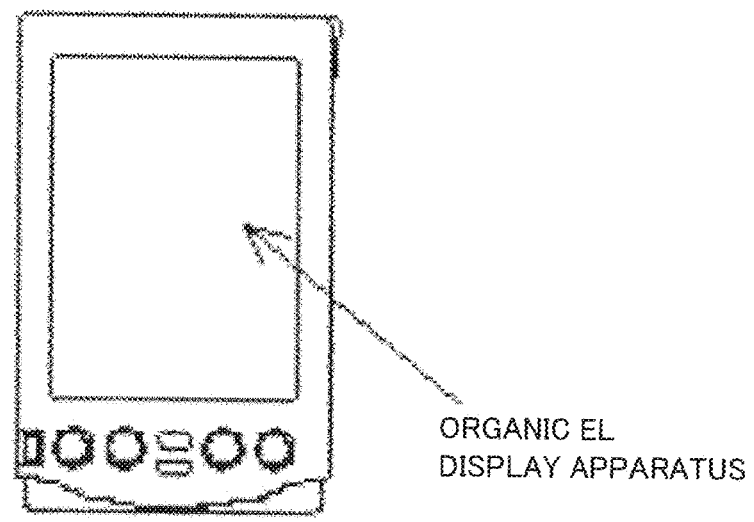
FIG. 37 is a schematic view illustrating another application of the organic EL display apparatus according to the second example.
Figure 38:
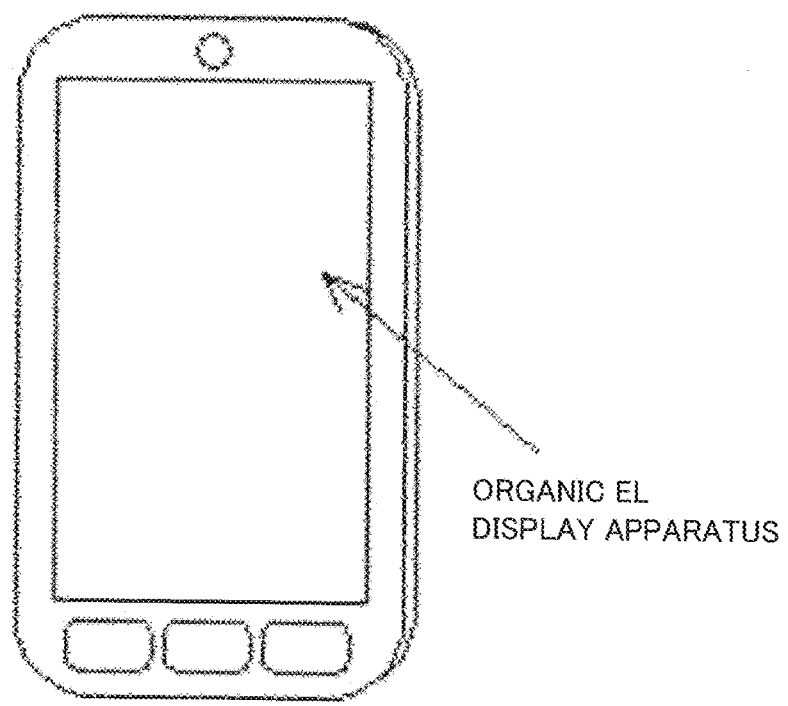
FIG. 38 is a schematic view illustrating another application of the organic EL display apparatus according to the second example.
Figure 39:
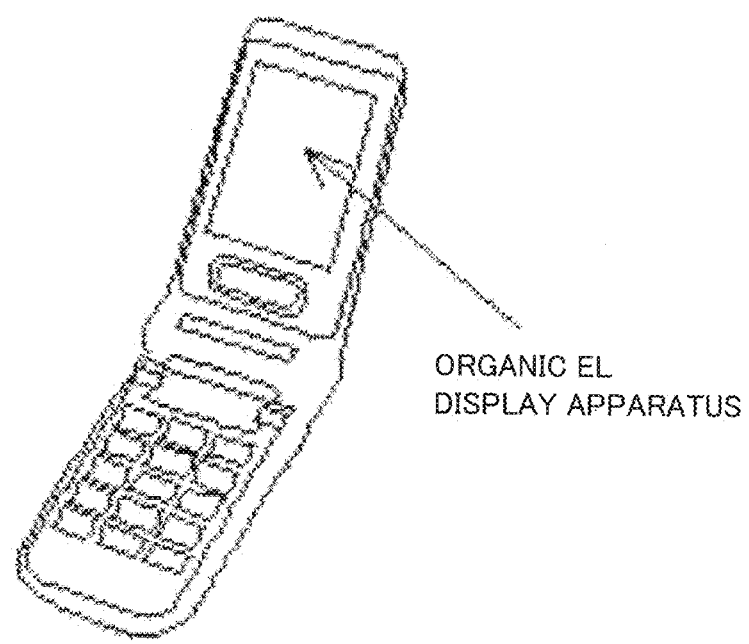
FIG. 39 is a schematic view illustrating another application of the organic EL display apparatus according to the second example.

FIGS. 36 to 39 illustrate examples of the electric equipment applicable to the electro-optical device (organic EL display apparatus) of the present embodiment. FIG. 36 is an example applied to a personal computer, FIG. 37 is an example applied to a mobile terminal device such as a personal digital assistant (PDA), an electronic organizer, an electronic book, or a tablet terminal, FIG. 38 is an example applied to a smart phone, and FIG. 39 is an example applied to a mobile phone. The organic EL display apparatus of the present embodiment may be used in a display unit of these electric equipment. Further, the electric equipment is not particularly limited so long as it comprises the display apparatus, and for example, may be applied to a digital camera, a video camera, a head-mounted display, a projector, a facsimile device, a portable TV, a demand side platform (DSP) or the like.

Example 3

Next, an electro-optical device and electric equipment according to a third example will be described with reference to FIGS. 40 to 43. In the above-described second example, examples in which the organic EL display apparatus as the electro-optical device is applied to the electric equipment comprising a planar display unit has been described, but it may be applied to electric equipment requiring a curved display unit by forming the organic EL display apparatus in a deformable structure.

Figure 40:
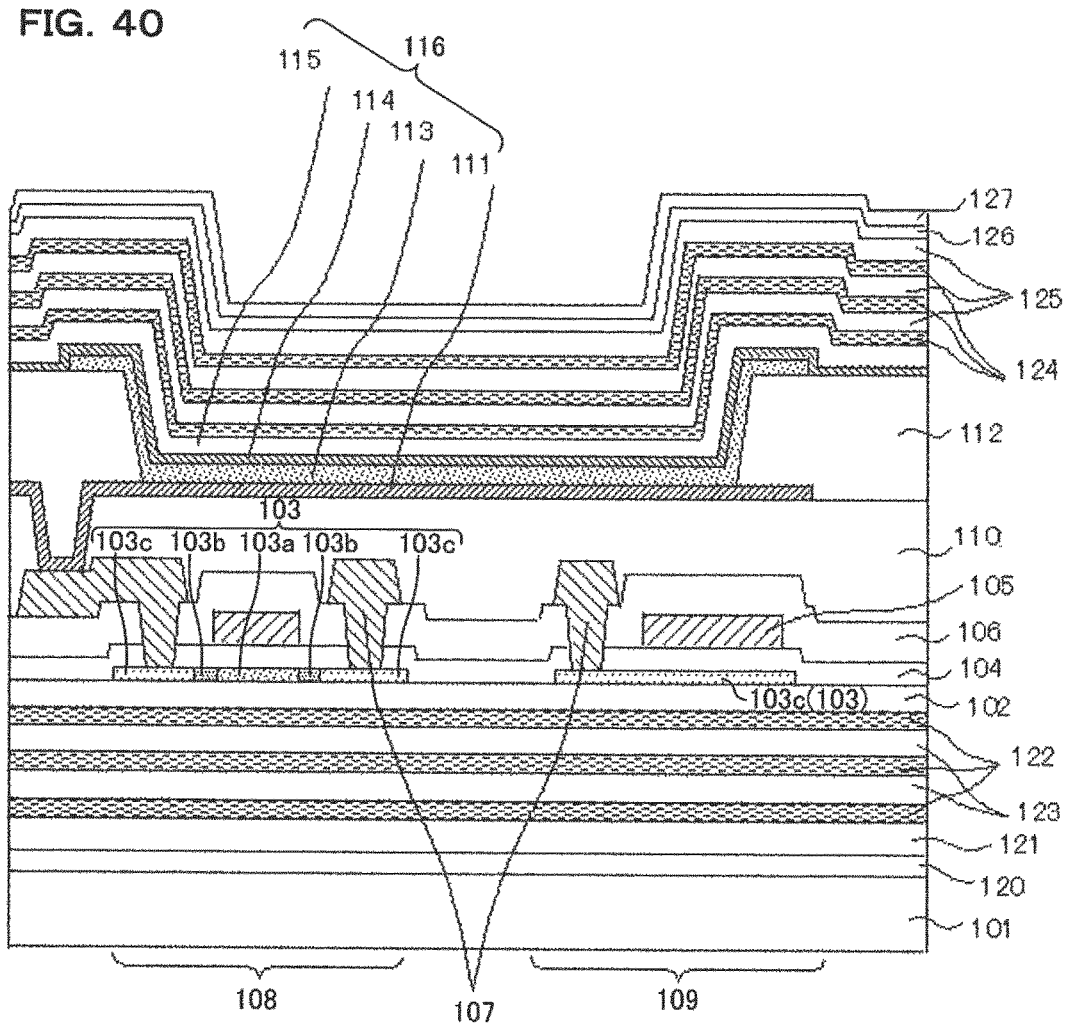
FIG. 40 is a cross-sectional view schematically illustrating a structure of an organic EL display apparatus according to a third example.

FIG. 40 is a cross-sectional view illustrating the deformable structure of the organic EL display apparatus, which is different from the first example in that: (1) a TFT unit 108 (an M1 switch TFT 108*a* and an M2 driving TFT 108*b*) and a holding capacitor part 109 are formed on a flexible substrate; and (2) a sealing glass substrate 200 is not disposed on a light emitting element 116.

First, regarding (1), a peeling film 120 of an organic resin, etc. which can be removed by peeling liquid is formed on a glass substrate 101, and a flexible substrate 121 having a flexibility is formed of polyimide, etc. thereon. Next, an inorganic thin film 122 such as a silicon oxide film or a silicon nitride film and an organic film 123 such as an organic resin are alternately laminated thereon. Then, according to the manufacturing method illustrated in the first example, an underlying insulation film 102, a polysilicon layer 103 (an i layer 103*a*, a p– layer 103*b*, and a p+ layer 103*c*), a gate insulation film 104, first metal layers 105, an interlayer insulation film 106, second metal layers 107, and a flattened film 110 are sequentially formed on an uppermost film (herein, the inorganic thin film 122), and the TFT unit 108 (the M1 switch TFT 108*a* and M2 driving TFT 108*b*) and the holding capacitor part 109 are formed.

In addition, regarding (2), an anode electrode 111 and an element separation film 112 are formed on the flattened film 110, and an organic EL layer 113, a cathode electrode 114, and a cap layer 115 are sequentially formed in an opening part formed by removing the element separation film 112 to form the light emitting element 116. Thereafter, an inorganic thin film 124 such as a silicon oxide film or a silicon nitride film and an organic film 125 such as an organic resin are alternately laminated on the cap layer 115, and a λ/4 retardation plate 126 and a polarizing plate 127 are formed on the uppermost film (herein the organic film 125).

Thereafter, the peeling film 120 on the glass substrate 101 is removed by peeling liquid, etc., and the glass substrate 101 is removed. Since this structure does not include the glass substrate 101 and sealing glass substrate 200, and the entire organic EL display apparatus can be deformed, it may be used in the electric equipment for various applications requiring the curved display unit, in particular, wearable electric equipment.

Figure 41:
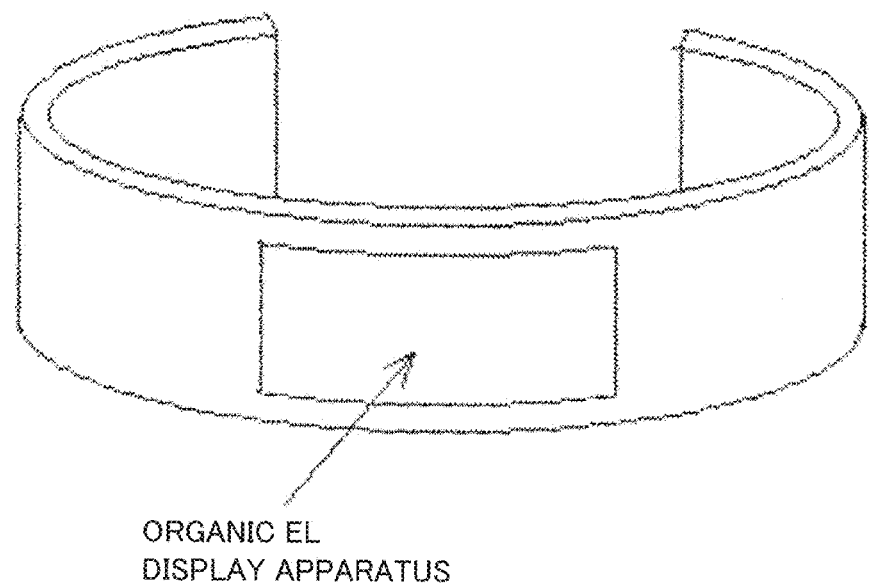
FIG. 41 is a schematic view illustrating an application of the organic EL display apparatus according to the third example.

For example, the organic EL display apparatus of the present embodiment may be used in the display unit of wristband type electric equipment (for example, a terminal in conjunction with the smart phone, a terminal having a function of a global positioning system (GPS), a terminal for measuring information of a human body such as pulse rate and body temperature, or the like) mounted on a wrist as illustrated in FIG. 41. In the case of the terminal in conjunction with the smart phone, image data and video data which are received using a communication means (for example, a near field communication unit that operates in compliance with the standards such as Bluetooth (registered trademark) or near field communication (NFC) previously provided in the terminal may be displayed in the organic EL display apparatus. In addition, in the case of the terminal having the GPS function, positional information, moving distance information, moving speed information, and the like, which are specified based on GPS signals may be displayed in the organic EL display apparatus. Further, in the case of the terminal for measuring the information of the human body, the measured information may be displayed in the organic EL display apparatus.

Figure 42:
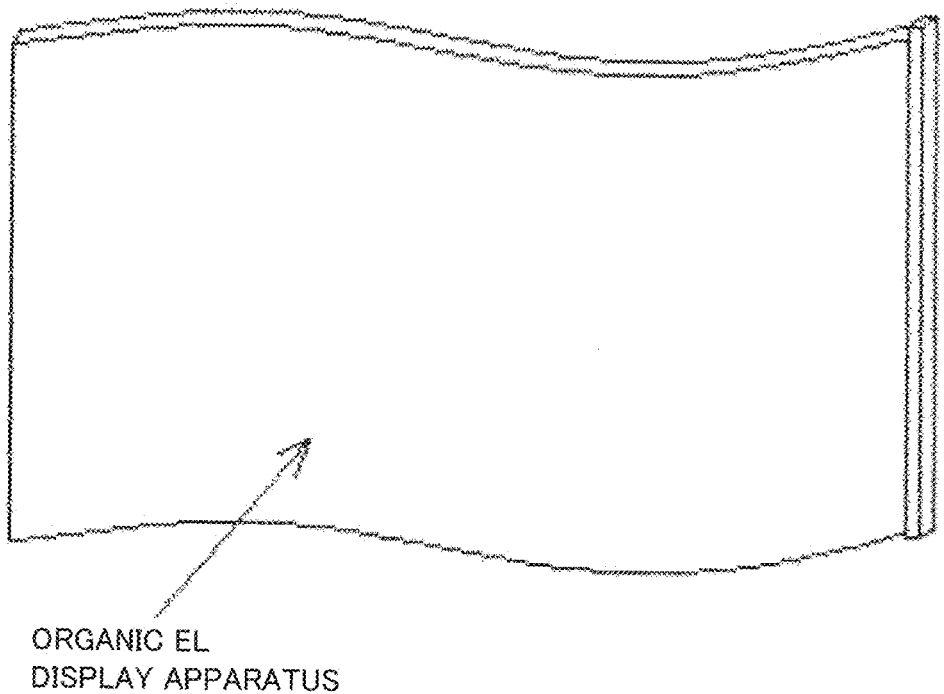
FIG. 42 is a schematic view illustrating another application of the organic EL display apparatus according to the third example.

In addition, the organic EL display apparatus of the present embodiment may be used in an electronic paper as illustrated in FIG. 42. For example, image data and video data which are stored in a storage unit provided in an end part of the electronic paper may be displayed in the organic EL display apparatus, or image data and video data which are received using an interface means provided in an end part of the electronic paper (for example, a wire communication unit such as a universal serial bus (USB) or a wireless communication unit that operates in compliance with standards such as Internet (registered trademark), fiber-distributed data interface (FDDI), Token Ring, or the like) may be displayed in the organic EL display apparatus.

Figure 43:
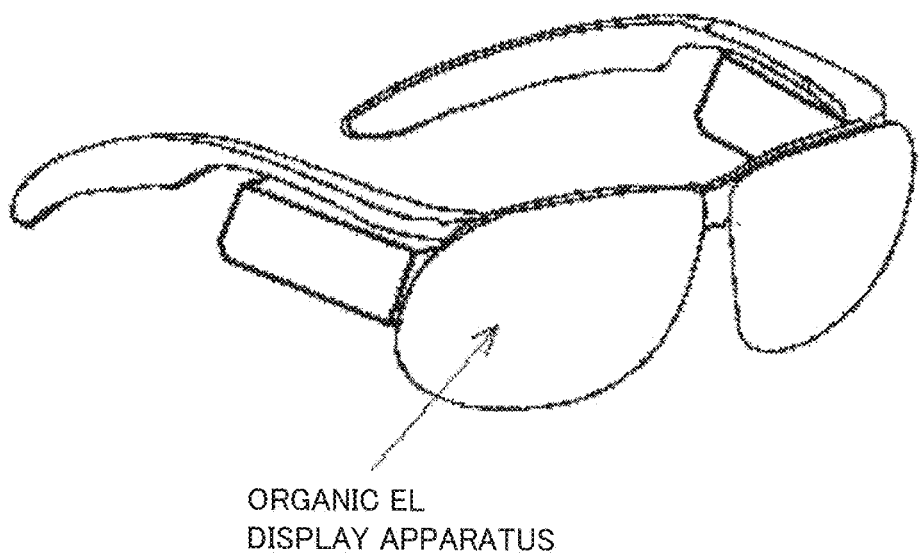
FIG. 43 is a schematic view illustrating another application of the organic EL display apparatus according to the third example.

Further, the organic EL display apparatus of the present embodiment may be used in the display unit of glass type electronic equipment mounted on a face as illustrated in FIG. 43. For example, image data and video data which are stored in a storage unit provided in temples of eyeglasses, sunglasses, goggles, and the like may be displayed in the organic EL display apparatus, or image data and video data which are received using an interface means provided in the temples and the like (for example, a wire communication unit such as the USB, a near field communication unit that operates in compliance with standards such as Bluetooth (registered trademark) or NFC, or a mobile communication which communicates using a mobile communication net such as long term evolution (LTE)/3G, or the like) may be displayed in the organic EL display apparatus.

According to the present embodiment, by depositing the organic EL material of the sub-pixels of B using the FMM having slot-shaped opening parts, it is possible to facilitate manufacture and handling of the FMM, and thus improve the manufacturing yield of the display device. Further, since relative positions of the light emitting regions of the sub-pixels of B with respect to the light emitting regions of R and G are different from each other in even columns and odd columns, when displaying a horizontal pattern, the color edge thereof is viewed as a pattern in a state of being averaged at all times. Therefore, when displaying a pattern of a simple white horizontal line, colors in odd rows and even rows do not appear different from each other. In addition, the organic EL material of the sub-pixels of B is deposited over the adjacent two pixels, such that the light emitting regions of the sub-pixels of B may be increased, and thereby the lifespan thereof may be increased. Further, the positions of the light emitting regions of the sub-pixels of B are shifted to the light emitting region side of the sub-pixels of G, such that a difference in the distance between the light emitting region of B and the light emitting region of G with respect to the pixels adjacent to each other in the column direction may be decreased, and thereby an occurrence of the color edge may be controlled to improve the display quality.

Further, it should be understood that the present invention is not limited to the above-described embodiment and examples, the type and structure of the electro-optical device, the material of each composition, and the manufacturing method may be appropriately modified, without departing from the spirit of the present invention.

For example, in the embodiment and examples, the sub-pixels are formed of the three colors of R, G and B, but the pixel arrangement structure of the present embodiment may be applied to any three colors having luminosity factors different from each other. In addition, the electro-optical device of the present embodiment is not limited to the organic EL display apparatus illustrated in the embodiment and examples. Further, the substrate on which the pixels are formed is not limited to the TFT substrate illustrated in the embodiment and examples. Furthermore, the substrate on which the pixels are formed is applicable to not only an active type substrate, but also a passive type substrate. Moreover, in the present embodiment, the circuit (a so-called 2T1C circuit) including the M1 switch TFT, the M2 driving TFT and the C1 holding capacitor has been exemplified as a circuit for controlling the pixel, but a circuit (for example, 3T1C circuit) including three or more transistors may also be employed.

The present embodiment may be used: in the S stripe type pixel arrangement structure in which the R and G are arranged in the same column, and the B is disposed in the next column of the R and G and in the row of R and G, in a display device having a pixel arrangement structure in which the sets including two pixels adjacent to each other in the column direction are repeatedly disposed in the column direction, and the sets including two pixels are repeatedly disposed in the adjacent column by shifting one pixel in the column direction; an electro-optical device such as the organic EL display apparatus comprising the display device; electric equipment using the electro-optical device as a display apparatus; an FMM for achieving the pixel arrangement structure; and a pixel array having the pixel arrangement structure.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

The invention claimed is:

1. A display device, comprising
a plurality of main pixels arranged in a matrix,
wherein each of the plurality of main pixels includes one sub-pixel of a first color arranged in a first column, one sub-pixel of a second color arranged adjacent to the sub-pixel of the first color in the first column, and one sub-pixel of a third color arranged in a second column adjacent to the first column,
the sub-pixels of the first color are linearly arranged in a first direction,
the sub-pixels of the second color are linearly arranged in the first direction, the sub-pixels of the third color are arranged in the first direction in a zigzag configuration,
in first and second main pixels adjacent to each other in a second direction different from the first direction, the sub-pixel of the first color of the first main pixel is arranged symmetrical to the sub-pixel of the second color of the second main pixel with respect to a first center line and the sub-pixel of the third color of the first main pixel is arranged symmetrical to the sub-pixel of the third color of the second main pixel with respect to a second center line, and
a position of the first center line is different from a position of the second center line in the second direction.

2. The display device according to claim 1,
wherein each of the sub-pixels of the first to third colors includes a transistor which drives the sub-pixel, an anode electrode connected to the transistor, a contact part which connects the transistor with the anode electrode, an element separation membrane formed on the anode electrode, a light emitting material formed so as to cover an opening part which is provided in the element separation membrane and defines a light emitting region of the sub-pixel, and a cathode electrode formed over the light emitting material, the light emitting region of the sub-pixel of the first color of the first main pixel is arranged symmetrical to the light emitting region of the sub-pixel of the second color of the second main pixel with respect to the first center line, and the light emitting region of the sub-pixel of the third color of the first main pixel is arranged symmetrical to the light emitting region of the sub-pixel of the third color of the second main pixel with respect to the second center line.

3. The display device according to claim 2,
wherein the light emitting material is an organic light emitting material.

4. The display device according to claim 3,
wherein the contact part of the sub-pixel of the first color and the contact part of the sub-pixel of the second color in a same main pixel are arranged at positions opposite to each other in the first direction, and the contact part of the sub-pixel of the third color of the first main pixel and the contact part of the sub-pixel of the third color of the second main pixel are arranged at positions opposite to each other in the second direction.

5. The display device according to claim 4,
wherein each of the light emitting regions of the two sub-pixels of the third color includes a concave in a vicinity of the contact part, and the concave of the sub-pixel of the third color of the first main pixel and the concave of the sub-pixel of the third color of the second main pixel are arranged at positions opposite to each other in the second direction.

6. The display device according to claim 3,
wherein the first center line is parallel to the second center line in the first direction.

7. The display device according to claim 1,
wherein the first color is a color with a highest luminosity factor and the third color is a color with a lowest luminosity factor.

8. An electro-optical device, comprising a display device according to claim 1.

9. An electric apparatus, comprising a display device according to claim 1 formed on a flexible substrate.

* * * * *

UNITED STATES PATENT AND TRADEMARK OFFICE
CERTIFICATE OF CORRECTION

| | | |
|---|---|---|
| PATENT NO. | : 10,312,295 B2 | Page 1 of 1 |
| APPLICATION NO. | : 15/972734 | |
| DATED | : June 4, 2019 | |
| INVENTOR(S) | : Yojiro Matsueda | |

It is certified that error appears in the above-identified patent and that said Letters Patent is hereby corrected as shown below:

On the Title Page

"(73) Assignee: TIANMA JAPAN, LTD., Kanagaw
(JP)"

Should be replaced with:
--(73) Assignee: TIANMA JAPAN, LTD., Kanagawa
(JP)--.

Signed and Sealed this
Twenty-first Day of April, 2020

Andrei Iancu
*Director of the United States Patent and Trademark Office*